United States Patent
Horikiri

(10) Patent No.: US 11,473,907 B2
(45) Date of Patent: Oct. 18, 2022

(54) METHOD FOR MANUFACTURING SEMICONDUCTOR STRUCTURE, INSPECTION METHOD, AND SEMICONDUCTOR STRUCTURE

(71) Applicants: SCIOCS COMPANY LIMITED, Ibaraki (JP); SUMITOMO CHEMICAL COMPANY, LIMITED, Tokyo (JP)

(72) Inventor: Fumimasa Horikiri, Ibaraki (JP)

(73) Assignees: SCIOCS COMPANY LIMITED, Ibaraki (JP); SUMITOMO CHEMICAL COMPANY, LIMITED, Tokyo (JP)

( * ) Notice: Subject to any disclaimer, the term of this patent is extended or adjusted under 35 U.S.C. 154(b) by 539 days.

(21) Appl. No.: 16/492,299

(22) PCT Filed: Feb. 28, 2018

(86) PCT No.: PCT/JP2018/007393
§ 371 (c)(1),
(2) Date: Nov. 7, 2019

(87) PCT Pub. No.: WO2018/168451
PCT Pub. Date: Sep. 20, 2018

(65) Prior Publication Data
US 2021/0131800 A1    May 6, 2021

(30) Foreign Application Priority Data
Mar. 14, 2017    (JP) .............................. JP2017-049073

(51) Int. Cl.
*G01B 11/30*    (2006.01)
*G01N 21/95*    (2006.01)
(Continued)

(52) U.S. Cl.
CPC ......... *G01B 11/30* (2013.01); *G01N 21/9501* (2013.01); *G01N 21/956* (2013.01);
(Continued)

(58) Field of Classification Search
CPC .. G01B 11/30; G01B 11/303; G01B 2210/42; G01B 2210/48; G01N 21/9501;
(Continued)

(56) References Cited

U.S. PATENT DOCUMENTS

2007/0192058 A1*    8/2007    Ishibashi ............... G01B 11/306
                                                            702/155
2009/0002688 A1*    1/2009    Soeda ................. G01N 21/9501
                                                            356/73
(Continued)

FOREIGN PATENT DOCUMENTS

JP    1-138404 A    5/1989
JP    3-274407 A    12/1991
(Continued)

OTHER PUBLICATIONS

English Translation of the International Preliminary Report on Patentability and Written Opinion for PCT/JP2018/007393 (dated Sep. 26, 2019).
(Continued)

*Primary Examiner* — Sunghee Y Gray
(74) *Attorney, Agent, or Firm* — Pearne & Gordon LLP

(57) ABSTRACT

There is provided a method for manufacturing a semiconductor structure, including: preparing a plate-like semiconductor structure; and inspecting the semiconductor structure, the inspection of the semiconductor structure further including: performing a measurement of irradiating a surface of the semiconductor structure with a light from a light source in an oblique direction to the surface, and detecting a reflected light reflected or scattered by the surface by a two-dimen-
(Continued)

sional detector, at a plurality of locations within at least a predetermined range of the surface of the semiconductor structure, to acquire a reflected light distribution that is a distribution of an integrated value obtained by integrating intensity of the reflected light measured at the plurality of locations, with respect to a position at the detector; and fitting the reflected light distribution by a multiple Gaussian function obtained by adding at least a first Gaussian function and a second Gaussian function distributed more widely than the first Gaussian function, to acquire a parameter of the second Gaussian function as an index corresponding to a surface roughness of the semiconductor structure.

7 Claims, 10 Drawing Sheets

(51) Int. Cl.
*G01N 21/956* (2006.01)
*H01L 21/67* (2006.01)
*H01L 21/66* (2006.01)
*H01L 29/20* (2006.01)
*H01L 29/34* (2006.01)

(52) U.S. Cl.
CPC ........ *H01L 21/67288* (2013.01); *H01L 22/12* (2013.01); *H01L 29/2003* (2013.01); *H01L 29/34* (2013.01)

(58) Field of Classification Search
CPC ....... G01N 21/956; G01N 2333/70546; G01N 33/56966; H01L 21/67288; H01L 22/12; H01L 29/2003; H01L 29/34; H01L 22/20; C07K 16/2842; C07K 2317/565

USPC ........................................................ 356/600
See application file for complete search history.

(56) References Cited

U.S. PATENT DOCUMENTS

| | | | | |
|---|---|---|---|---|
| 2009/0257058 | A1* | 10/2009 | Urano | G01N 21/9503 356/237.2 |
| 2010/0060895 | A1* | 3/2010 | Oshima | G01N 21/9501 356/369 |
| 2012/0044505 | A1* | 2/2012 | Matsui | G01N 21/9501 356/612 |
| 2014/0253912 | A1* | 9/2014 | Honda | G01N 21/9501 356/237.5 |
| 2015/0370175 | A1* | 12/2015 | Nicolaides | G03F 7/7085 355/77 |
| 2016/0300767 | A1* | 10/2016 | Ko | G01B 11/14 |
| 2019/0362992 | A1* | 11/2019 | Monodane | B23K 26/0823 |

FOREIGN PATENT DOCUMENTS

| | | |
|---|---|---|
| JP | 6-221811 A | 8/1994 |
| JP | 2011-203245 A | 10/2011 |
| JP | 2014-73918 A | 4/2014 |
| JP | 2016-50944 A | 4/2016 |
| JP | 2016-181534 A | 10/2016 |
| WO | 2014/038634 A1 | 3/2014 |

OTHER PUBLICATIONS

International Search Report issued in Application No. PCT/JP2018/007393 dated Apr. 10, 2018.
Written Opinion issued in Application No. PCT/JP2018/007393 dated Apr. 10, 2018.

* cited by examiner (a)

(b)

(a)

(b)

METHOD FOR MANUFACTURING SEMICONDUCTOR STRUCTURE, INSPECTION METHOD, AND SEMICONDUCTOR STRUCTURE

TECHNICAL FIELD

The present invention relates to a method for manufacturing a semiconductor structure, an inspection method, and a semiconductor structure.

DESCRIPTION OF RELATED ART

An optical non-contact measurement method may be used to measure a surface roughness or the like of a measurement object. In such a method, for example, the measurement object is irradiated with a light, and a reflected light reflected or scattered from the measurement object is measured two-dimensionally, to acquire a reflected light distribution. When the reflected light distribution is acquired, for example, the reflected light distribution is approximated by Gaussian function, and a surface roughness is calculated based on a standard deviation of the Gaussian function (for example, Patent Document 1).

PRIOR ART DOCUMENT

Patent Document
[Patent Document 1] Japanese Patent Laid-Open Publication No. 1994-221811

SUMMARY OF THE INVENTION

Problem to be Solved by the Invention

However, in the measurement method described in Patent Document 1, the surface roughness calculated from the standard deviation of the Gaussian function is different in some cases, from an actual value of the surface roughness obtained by another contact-type measurement method or the like. That is, the standard deviation of the Gaussian function corresponds to the surface roughness of the measurement object with low accuracy in some cases.

An object of the present invention is to provide a technique capable of correlating a parameter to the surface roughness and the curving amount of the measurement object with high accuracy, the parameter being obtained by fitting the reflected light distribution of the measurement object.

Means for Solving the Problem

According to an aspect of the present invention, there is provided a method for manufacturing a semiconductor structure and techniques relating thereto, including:
preparing a plate-like semiconductor structure; and
inspecting the semiconductor structure,
the inspection of the semiconductor further including:
performing a measurement of irradiating a surface of the semiconductor structure with a light from a light source in an oblique direction to the surface, and detecting a reflected light reflected or scattered by the surface by a two-dimensional detector, at a plurality of locations within at least a predetermined range of the surface of the semiconductor structure, to acquire a reflected light distribution that is a distribution of an integrated value obtained by integrating intensity of the reflected light measured at the plurality of locations, with respect to a position at the detector; and
fitting the reflected light distribution by a multiple Gaussian function obtained by adding at least a first Gaussian function and a second Gaussian function distributed more widely than the first Gaussian function, to acquire a parameter of the second Gaussian function as an index corresponding to a surface roughness of the semiconductor structure.

Advantage of the Invention

According to the present invention, the parameter can be correlated to the surface roughness and the curving amount of the measurement object with high accuracy, the parameter being obtained by fitting the reflected light distribution of the measurement object.

BRIEF DESCRIPTION OF THE DRAWINGS

FIG. 7(a) is a diagram illustrating an example of the reflected light distribution obtained by measuring the semiconductor structure, and. FIG. 7(b) is a diagram illustrating a normalized reflected light distribution and the multiple Gaussian function for fitting this distribution.

DETAILED DESCRIPTION OF THE INVENTION

<Finding Obtained by the Inventors>

Figure 1:
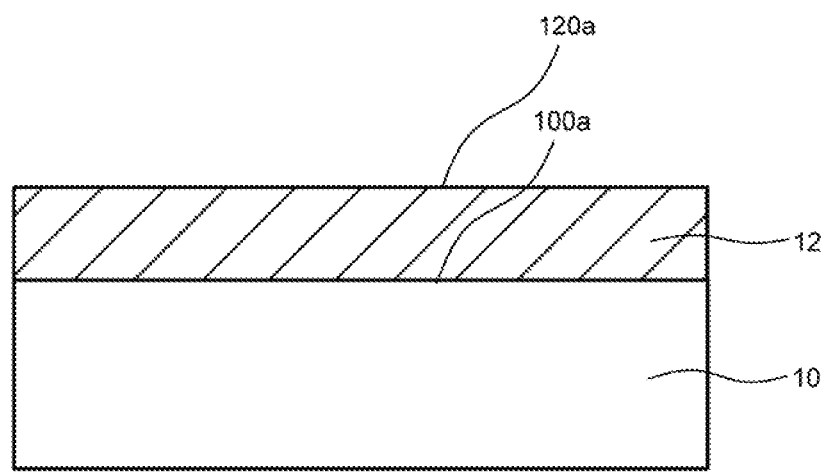
FIG. 1 is a schematic cross-sectional diagram illustrating a semiconductor structure according to an embodiment of the present invention.

Finding obtained by the present inventors will be described first.

(Problems with a Measurement Method of Patent Document 1)

In the measurement method described in Patent Document 1, as described above, there is sometimes a case such that the surface roughness calculated from the standard deviation of the Gaussian function differs from the actual measured surface roughness obtained by another contact-type measurement method.

Regarding the reason for causing the above case, intensive study is performed by the inventors of the present invention. Then, it is found that when a measurement object is curved such as warp, the surface roughness calculated from the standard deviation of the Gaussian function is different from the above actual value. If the measurement object is curved, reflected light on the surface of the measurement object can be scattered due to not only the roughness of the measurement object but also the curving of the measurement object. Therefore, even if the reflected light distribution is approximated by a single Gaussian function as in the method described in Patent Document 1, it cannot be approximated well, and the approximation accuracy may be lowered. As a result, the surface roughness calculated from the standard deviation of the Gaussian function will differ from the actual value.

Accordingly, when the measurement object is not only rough but also curved, it is important how to analyze an influence of the curving of the measurement object and an influence of the roughness of the measurement object separately.

(Problem with the Semiconductor Structure)

Group III nitride semiconductor such as gallium nitride (GaN) has a higher saturation free electron velocity and a higher withstand voltage than silicon. Therefore, the group III nitride semiconductor is expected to be applied to semiconductor devices such as power devices that control electric power and the like. Specific examples of the semiconductor device include a Schottky barrier diode (SBD) and a pn junction diode and the like.

In these semiconductor devices, if the surface of an uppermost layer (for example, a drift layer) in contact with an upper electrode is rough, electric field concentration may occur in a rough portion of an uppermost layer during reverse bias application, and the withstand voltage may be lowered. Accordingly, in order to improve the withstand voltage of the semiconductor device during reverse bias application, the surface of the uppermost layer is required to be flat.

Conventionally, in a manufacturing step of the semiconductor structure as a precursor of the semiconductor device, in order to confirm the flatness of the uppermost layer of the semiconductor structure, contact-type measurement of the surface roughness may be performed to the semiconductor structure. However, in the contact-type measurement, a measurable range at one time was narrow, and it was about 1 mm square at maximum. Further, in the contact-type measurement, the measurement time for measuring a predetermined range was long. Therefore, it has been difficult to perform the contact-type measurement on an entire surface of the semiconductor structure and/or on the total number of semiconductor structures. As a result, it has been difficult to detect a defective semiconductor device having a large surface roughness of the uppermost layer.

The present invention described below is based on the above-described new problem found by the present inventors.

<An Embodiment of the Present Invention>

An embodiment of the present invention will be described hereafter, with reference to the drawings.

(1) Semiconductor Structure

With reference to FIG. 1, a semiconductor structure 10 according to an embodiment of the present invention will be described hereafter. FIG. 1 is a schematic cross-sectional diagram illustrating the semiconductor structure according to an embodiment of the present invention.

The semiconductor structure 10 of this embodiment is configured as, for example, a semiconductor laminate that is a precursor for manufacturing SBD, and includes a substrate 100 and a semiconductor layer (epitaxial growth layer, drift layer) 120.

(Substrate)

The substrate 100 is made of, for example, a group III nitride semiconductor, and is configured as a base substrate on which the semiconductor layer 120 is epitaxially grown. In this embodiment, the substrate 100 is, for example, a GaN free-standing substrate.

The substrate 100 has a main surface 100a. The main surface 100a of the substrate 100 is, for example, a +c-plane ((0001) plane) or a plane having a predetermined off angle with respect to the +c-plane. The off-angle here is an angle formed between a normal direction of the main surface 100a and a main axis direction (c-axis direction) of the group III nitride semiconductor crystal constituting the substrate 100. In this embodiment, the off angle of the main surface 100a is, for example, 0° or more and 1.2° or less.

An arithmetic mean roughness Ra of the main surface 100a of the substrate 100 is, for example, 10 nm or less, preferably 5 nm or less.

The conductivity type of the substrate 100 is, for example, n-type. The n-type impurity in the substrate 100 is, for example, silicon (Si) or germanium (Ge). The n-type impurity concentration of the substrate 100 is, for example, $1 \times 10^{18}$ cm$^{-3}$ or more and $1 \times 10^{19}$ cm$^{-3}$ or less.

A thickness of the substrate 100 depends on a diameter of the substrate 100 and is not particularly limited, but is, for example, 300 µm or more and 2 mm or less. Here, for example, the diameter of the substrate 100 is 2 inches, and the thickness of the substrate 100 is 400 µm.

(Semiconductor Layer)

The semiconductor layer 120 is provided on the substrate 100 and configured to function as a drift layer, for example. The semiconductor layer 120 is made of, for example, a group III nitride semiconductor like the substrate 100, and is made of, for example, GaN in this embodiment.

The conductivity type of the semiconductor layer 120 is n-type, for example. Similarly to the n-type impurity in the substrate 100, the n-type impurity in the semiconductor layer 120 is, for example, Si or Ge.

The n-type impurity concentration of the semiconductor layer 120 is lower than the n-type impurity concentration of the substrate 100. Specifically, the n-type impurity concentration of the semiconductor layer 120 is, for example, $3 \times 10^{15}$ cm$^{-3}$ or more and $5 \times 10^{16}$ cm$^{-3}$ or less. Since the n-type impurity concentration of the semiconductor layer 120 is $3 \times 10^{15}$ cm$^{-3}$ or more, on-resistance of the semiconductor device manufactured by the semiconductor structure 10 can be reduced. Further, since the n-type impurity concentration of the semiconductor layer 120 is $5 \times 10^{16}$ cm$^{-3}$ or less, the withstand voltage of the semiconductor device during reverse bias application can be improved.

The thickness of the semiconductor layer 120 is, for example, 10 μm or more and 30 μm or less. Since the thickness of the semiconductor layer 120 is 10 μm or more, the withstand voltage of the semiconductor device during reverse bias application can be improved. Further, since the thickness of the semiconductor layer 120 is 30 μm or less, the on-resistance of the semiconductor device manufactured by the semiconductor structure 10 can be reduced.

The semiconductor layer 120 has a main surface 120a as a surface opposite to the substrate 100. Hereinafter, the main surface 120a of the semiconductor layer 120 is also referred to as "the surface of the semiconductor structure 10".

The main surface 120a of the semiconductor layer 120 may become rough, depending on the state of the substrate 100 (surface roughness, etc.) and the growth conditions of the semiconductor layer 120, etc. However, from a viewpoint of improving the withstand voltage of the semiconductor device during reverse bias application, it is preferable that the roughness of the main surface 120a of the semiconductor layer 120 is reduced in the semiconductor structure 10 that is selected as a non-defective product described later.

Specifically, the arithmetic mean roughness Ra of the main surface 120a of the semiconductor layer 120 is, for example, 30 nm or less, preferably 15 nm or less. Accordingly, a high yield can be ensured by setting 10% or less ratio of the semiconductor device not satisfying a design withstand voltage during reverse bias application. The design withstand voltage here is determined by a carrier concentration and a film thickness of the semiconductor layer 120, and typically, for example, 1.2 kV or more, Further, a lower limit value of the arithmetic mean roughness Ra of the main surface 120a of the semiconductor layer 120 is not particularly limited because it is preferably as small as possible, but is about 1 nm because it is difficult to make the arithmetic mean roughness Ra of the main surface 120a of the semiconductor layer 120 equal to or less than the arithmetic mean roughness Ra of the main surface 100a of the substrate 100.

Hereinafter, the arithmetic mean roughness Ra of the main surface 120a of the semiconductor layer 120 of the semiconductor structure 10 may be referred to as "arithmetic mean roughness Ra of the semiconductor structure 10".

Further, the "rough area ratio", which is the ratio of the area of the roughened portion to a total area of the main surface 100a of the semiconductor layer 120 (the area of the surface of the semiconductor structure 10), is for example, 50% or less, preferably 20% or less. The rough area ratio here is one of the indexes of surface roughness. Further, the "roughened portion" means a portion having a surface roughness of more than 15 nm in the main surface 100a of the semiconductor layer 120. Since the rough area ratio of the semiconductor layer 120 is 50% or less, preferably 20% or less, in a semiconductor device manufactured in at least a predetermined region of the semiconductor structure 10, a high yield can be ensured by setting 10% or less ratio of the semiconductor device not satisfying the design withstand voltage during reverse bias application. The lower limit of the rough area ratio of the semiconductor layer 120 is preferably as small as possible, for example, 0%.

The state where the rough area ratio of the semiconductor layer 120 is 50% or less, preferably 20% or less, corresponds to $\sigma_2 \leq 90$, preferably $\sigma_2 \leq 50$. Here, the above equation is expressed using a parameter $\sigma_2$ when the reflected light distribution of the semiconductor structure 10 to be described later is fitted by a multiple Gaussian function.

Hereinafter, the rough area ratio of the semiconductor layer 120 of the semiconductor structure 10 may be referred to as "the rough area ratio of the semiconductor structure 10".

Further, curving occurs in the semiconductor structure 10 in some cases, depending on a state of the substrate 100 (surface roughness, etc.) and the growth conditions of the semiconductor layer 120, etc. However, from a viewpoint of suppressing yield reduction in the step of manufacturing a semiconductor device using the semiconductor structure 10, it is preferable that the curving is reduced in the semiconductor structure 10 selected as a non-defective product described later. The "curving" of the semiconductor structure 10 here includes warping or waviness and the like of the semiconductor structure 10, and in other words, a deformation of the semiconductor structure 10. Further, an amount of the curving may be referred to as a "curving amount" hereafter in some cases.

Specifically, the warp (warp amount, SORI) of the semiconductor structure 10 is, for example, 50 μm or less, preferably 20 μm or less. The "warp" here means a value calculated as sum A+B: wherein when a reference plane is a least-square plane that minimizes the square of a distance to each point in the surface of the semiconductor structure 10 (a main surface 120a of the semiconductor layer 120), the distance A is the distance between the least-square plane and a point of the surface of the semiconductor structure 10 that is most distant from the least-square plane to one side, and the distance B is the distance between the least square plane and a point of the surface of the semiconductor structure 10 that is most distant from the least square plane to the other side. Since the warp of the semiconductor structure 10 is 50 μm or less, preferably 20 μm or less, defocusing can be suppressed in the photolithography process, and occurrence of a pattern defect can be suppressed. The lower limit value in the warp of the semiconductor structure 10 is preferably as small as possible, for example, 0%.

A state in which the warp of the semiconductor structure 10 is 20 μm or less, corresponds to at least $0.5 \leq A_1 \leq 1$. Here, the above equation is expressed using a parameter $A_1$ when the reflected light distribution of the semiconductor structure 10 to be described later is fitted by a multiple Gaussian function.

Further, an "inclined area ratio" which is a ratio of the area of a portion of the surface of the semiconductor structure 10 where the inclination such as warp or waviness has occurred with respect to the area of the surface of the semiconductor structure 10 is, for example, 80% or less, preferably 50% or less. "The portion where the inclination such as warp and waviness has occurred" here means a portion inclined at a predetermined angle (for example, 0.01° to 0.05°) when optical interference type flatness measurement is performed on the surface of the semiconductor structure 10. Since the inclined area ratio is 80% or less, preferably 50% or less, defocusing can be suppressed in the photolithography step, and occurrence of the pattern defect can be suppressed. The lower limit value of the inclined area ratio is preferably as small as possible, for example, 0%.

(2) Inspection Device

Figure 2:
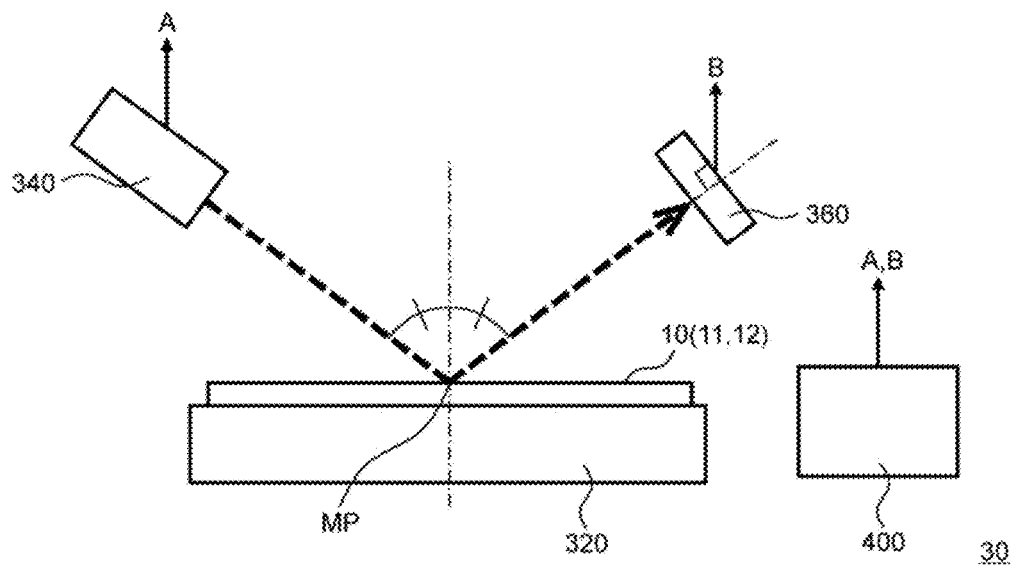
FIG. 2(a) is a schematic front diagram illustrating an inspection device according to an embodiment of the present invention and FIG. 2(b) is a schematic top diagram illustrating the inspection device according to an embodiment of this invention.
Figure 2:
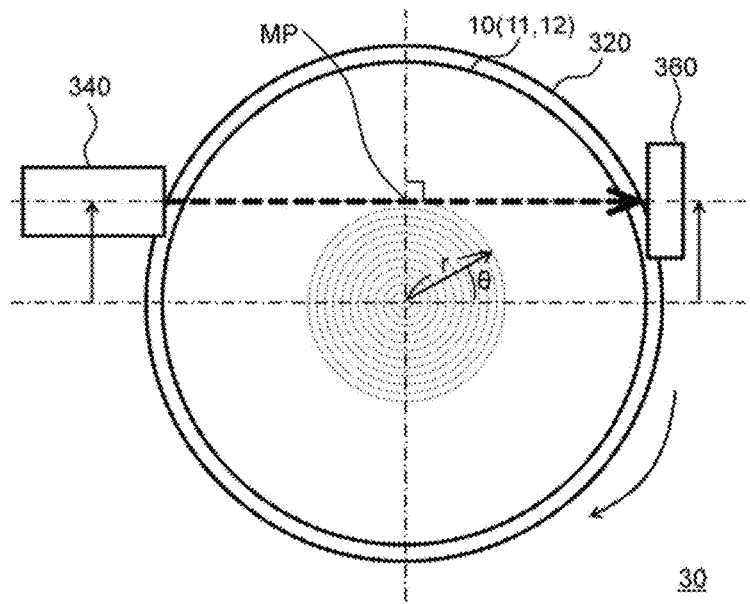
Figure 3:
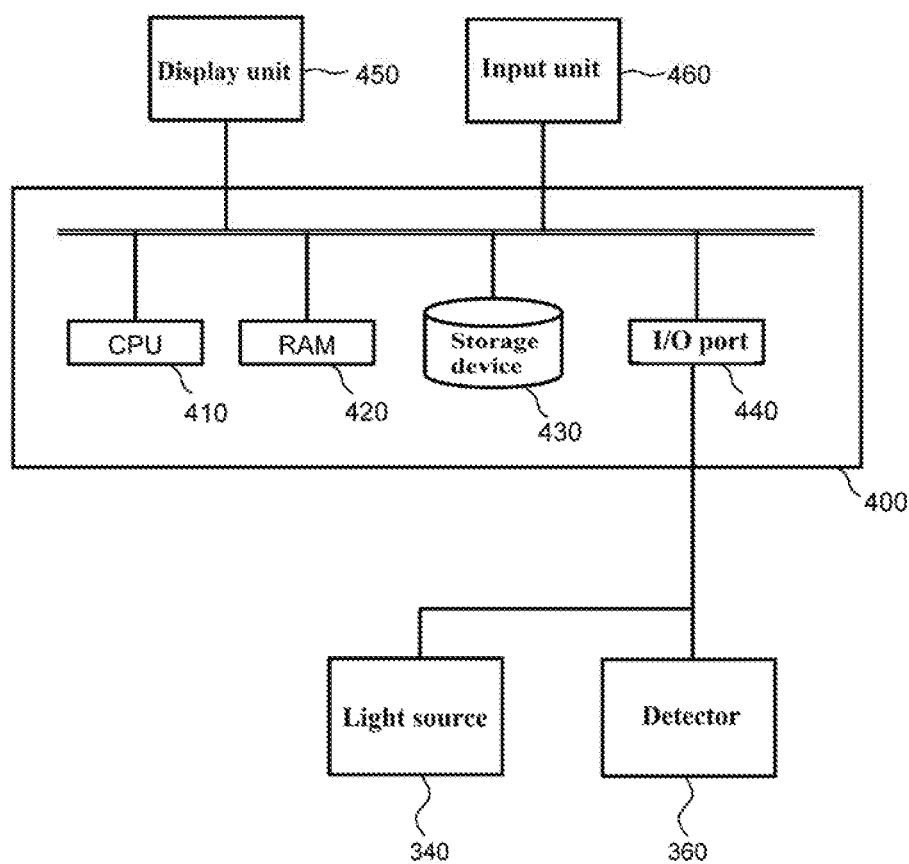
FIG. 3 is a schematic configuration diagram illustrating a control unit of the inspection device.

With reference to FIGS. 2 and 3, an inspection device 30 according to this embodiment will be described next. FIG. 2(a) is a schematic front diagram illustrating an inspection device according to an embodiment of the present invention, and FIG. 2(b) is a schematic top diagram illustrating the inspection device according to an embodiment of this invention.

As shown in FIG. 2(a) and FIG. 2(b), the inspection device 30 according to this embodiment is configured as an optical non-contact-type surface shape measuring device, and for example, includes a stage 320, a light source 340, and a detector 360.

The stage 320 is configured to horizontally support a plate-like semiconductor structure 10 (a reference structure 11 and an inspection structure 12 described later) as a measurement object. Further, the stage 320 is configured such that the semiconductor structure 10 can be rotated in a circumferential direction at a predetermined speed.

The light source 340 is configured to irradiate the semiconductor structure 10 with a light having a predetermined wavelength, and for example, is configured as a laser diode that irradiates a laser light having a wavelength of 405 nm. Further, the light source 340 is disposed to irradiate the surface of the semiconductor structure 10 with a light in an oblique direction (thick dotted line) to the surface. An irradiation angle of the light irradiated from the light source 340 to the surface of the semiconductor structure 10 (light irradiation angle with respect to a direction perpendicular to the surface) is, for example, 50° or more and 80° or less (assuming normal incidence is 0°). Hereinafter, a point where the light is irradiated from the light source 340 to the surface of the semiconductor structure 10 is referred to as a "measurement point MP".

A light source side optical system (not shown) including a lens for condensing the light on the semiconductor structure 10 from the light source 340, may be provided between the light source 340 and the stage 320.

The detector 360 is configured to two-dimensionally detect the reflected light reflected or scattered by the surface of the semiconductor structure 10, and for example, it is configured as a CCD (Charge Coupled Device) or CMOS (Complementary Metal Oxide Semiconductor). The "reflected light" here includes a regular reflected light (specularly reflected light) that is regularly reflected by the surface of the measurement object and a scattered light that is scattered by the surface of the measurement object.

The detector 360 is disposed to detect the reflected light reflected or scattered by the surface of the semiconductor structure 10 evenly around the regular reflected light. That is, a normal direction of the detector 360 coincides with a direction of the regular reflected light incident on the detector 360 (thick dotted line). Further, the center of the detector 360 coincides with an incident point (hereinafter also referred to as a "regular reflection point") of the regular reflected light incident on the detector 360.

A detector-side optical system (not shown) for condensing a light on the detector 360, the light being scattered by the surface of the semiconductor structure 10, may be provided between the detector 360 and the stage 320.

The light source 340 and the detector 360 are configured movably in a horizontal direction perpendicular to light emission direction from the light source 340 in plan view, with a relative positional relationship of each other fixed. Therefore, since the light source 340 and the detector 360 move in the horizontal direction with the stage 320 rotated at a predetermined speed, the reflected light can be measured over an entire surface of the semiconductor structure 10. Details of a measurement step will be described later.

A control unit 400 is configured to control the light source 340 and the detector 360.

As shown in FIG. 3, the control unit 400 includes, for example, a CPU (Central Processing Unit) 410, a RAM (Random Access Memory) 420, a storage device 430, and an I/O port 440. The RAM 420, the storage device 430, and the I/O port 440 are configured to exchange data with the CPU 410. Further, a display unit 450 and an input unit 460 are connected to the control unit 400.

The I/O port 440 is connected to the light source 340 and the detector 360. Therefore, the control unit 400 can transmit and receive predetermined signals to and from the light source 340 and the detector 360.

The storage device 430 is configured to store various data and programs related to the control of the light source 340 and the detector 360. The storage device 430 is configured to readably store, for example, a control program for the light source 340 and the detector 360, a reflected light distribution detected by the detector 360, a multiple Gaussian function fitting program for the reflected light distribution, each of parameters of the Gaussian functions that constitute the multiple Gaussian function, a reference value used for quality determination of the semiconductor structure 10, and the like.

The RAM 420 is configured to temporarily hold various data and programs read from the storage device 430 by the CPU 410.

The CPU 410 is configured to control the light source 340 and the detector 360 by executing a predetermined program stored in the storage device 430. The control by the control unit 400 will be described later.

The predetermined program is installed in the control unit 400 and used. But prior to the installation, the program may be provided by being stored in a storage medium readable by the control unit 400, or may be provided to the control unit 400 through a communication line (such as an optical fiber) connected to the control unit 400.

The display unit 450 is configured to display information such as a measurement result of the reflected light distribution and a fitting result by the multiple Gaussian function, for an administrator of the inspection device 30. The display unit 450 is, for example, a liquid crystal display or an organic LED display. On the other hand, the input unit 460 is configured such that the administrator of the inspection device 30 inputs information to the control unit 400. Specifically, the input unit 460 is a mouse or a keyboard. The display unit 450 and the input unit 460 may be configured to serve as both of the mouse and the keyboard by a touch panel.

(3) Method for Manufacturing a Semiconductor Structure

Figure 4:
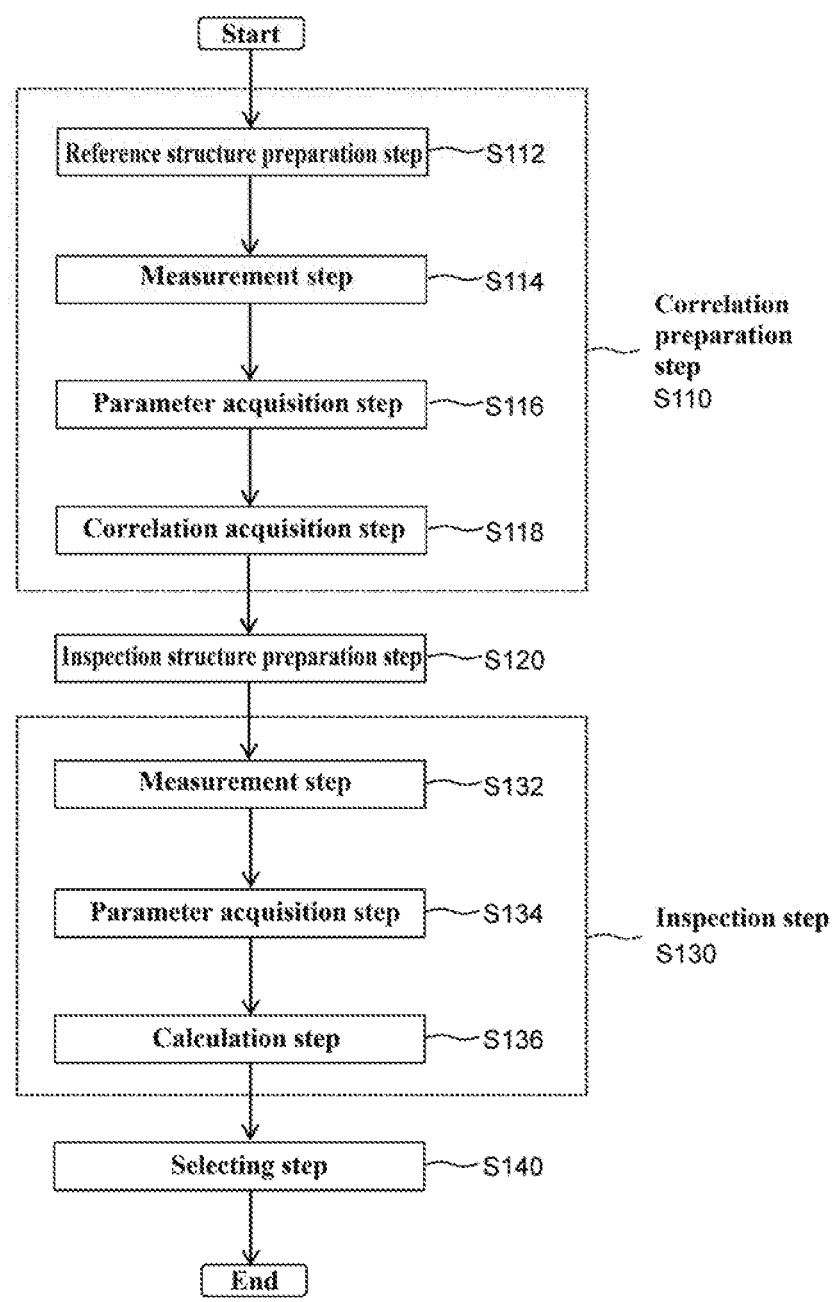
FIG. 4 is a flowchart illustrating a method for manufacturing a semiconductor structure according to an embodiment of the present invention.

With reference to FIGS. 1, 2, and 4, a method for manufacturing a semiconductor structure (and an inspection method) according to this embodiment will be described next. FIG. 4 is a flowchart illustrating a method for manufacturing a semiconductor structure according to an embodiment of the present invention. Step is abbreviated as S.

(S110: Correlation Preparation Step)

First, in correlation preparation step S110, a correlation (calibration curve) is prepared, in which parameters of the multiple Gaussian function fitted to the reflected light distribution of the semiconductor structure 10 are correlated to the surface roughness or the curving amount of the semiconductor structure 10. The correlation preparation step S110 of this embodiment includes, for example, a reference structure preparation step S112, a measurement step S114, a parameter acquisition step S116, and a correlation acquisition step S118.

(S112: Reference Structure Preparation Step)

In the reference structure preparation step S112, a plurality of reference structures 11 are prepared as the semiconductor structures 10 that serve as a reference for acquiring the correlation.

Specifically, as shown in FIG. 1, first, for example, an n-type GaN free-standing substrate is prepared as the substrate 100. Next, for example, a semiconductor layer 120 made of n-type GaN and having a thickness of 20 μm, is formed on the substrate 100 by metal organic vapor phase epitaxy (MOVPE: Metal Organic Vapor Phase Epitaxy). Thereby, the reference structure 11 having the substrate 100 and the semiconductor layer 120 is manufactured.

Here, a plurality of reference structures 11 are produced for example under a condition such that at least one of the state of the substrate 100 (surface roughness, etc.) and the growth conditions (growth pressure, growth temperature, source gas partial pressure ratio, etc.) of the semiconductor layer 120 is different from a predetermined optimum condition (for example, within manufacturing variations). Note that one of the plurality of reference structures 11 may be manufactured under the optimum condition.

(S114: Measurement Step)

Next, the curving amount and the surface roughness are measured for each of the plurality of reference structures 11. For example, measurement of the curving amount of the reference structure 11 (actual values such as warp, waviness, WARP, BOW, and inclined area ratio) is performed using an optical interference type flatness measuring device, a laser displacement meter, etc. Further, for example, measurement of the surface roughness (actual value of the arithmetic mean roughness Ra, etc.) of the reference structure 11 is performed using a contact-type measuring device such as AFM (Atomic Force Microscope). Further, for example, measurement of the rough area ratio of the semiconductor layer 120 of the reference structure 11 is performed by observing the main surface 120a of the semiconductor layer 120 using a Nomarski microscope or the like.

On the other hand, measurement of the reflected light distribution is performed for each of the plurality of reference structures 11 using the inspection device 30 described above.

Specifically, as shown in FIG. 2(a) and FIG. 2(b), first, the reference structure 11 is placed on the stage 320. When the reference structure 11 is placed, the arrangement of the light source 340 and the detector 360 is initialized so that a start point of the measurement point MP is the center of the stage 320, that is, the center of the semiconductor structure 10. When the arrangement of the light source 340 and detector 360 is initialized, the reference structure 11 is rotated at a predetermined speed by rotating the stage 320. Further, a measurement of irradiating a surface of the semiconductor structure with a light from the light source 340 and detecting a reflected light reflected or scattered by the surface by the detector 360, is started.

After the measurement is started, measurement of the reflected light is performed at a plurality of locations within at least a predetermined range of the surface of the semiconductor structure 10. In this embodiment, for example, measurement of the reflected light is performed over the entire surface of the semiconductor structure 10. Specifically, the light source 340 and the detector 360 are moved in a horizontal direction perpendicular to the light emission direction from the light source 340 in plan view, in a state of rotating the reference structure 11 while a relative positional relationship between the light source 340 and the detector 360 is fixed. That is, the measurement point MP on the surface of the semiconductor structure 10 is moved in a radial direction of the semiconductor structure 10. Thereby, a locus of the measurement point MP in the surface of the semiconductor structure 10 can be made spiral in a plan view. As a result, the reflected light can be measured over the entire surface of the semiconductor structure 10.

Figure 7:
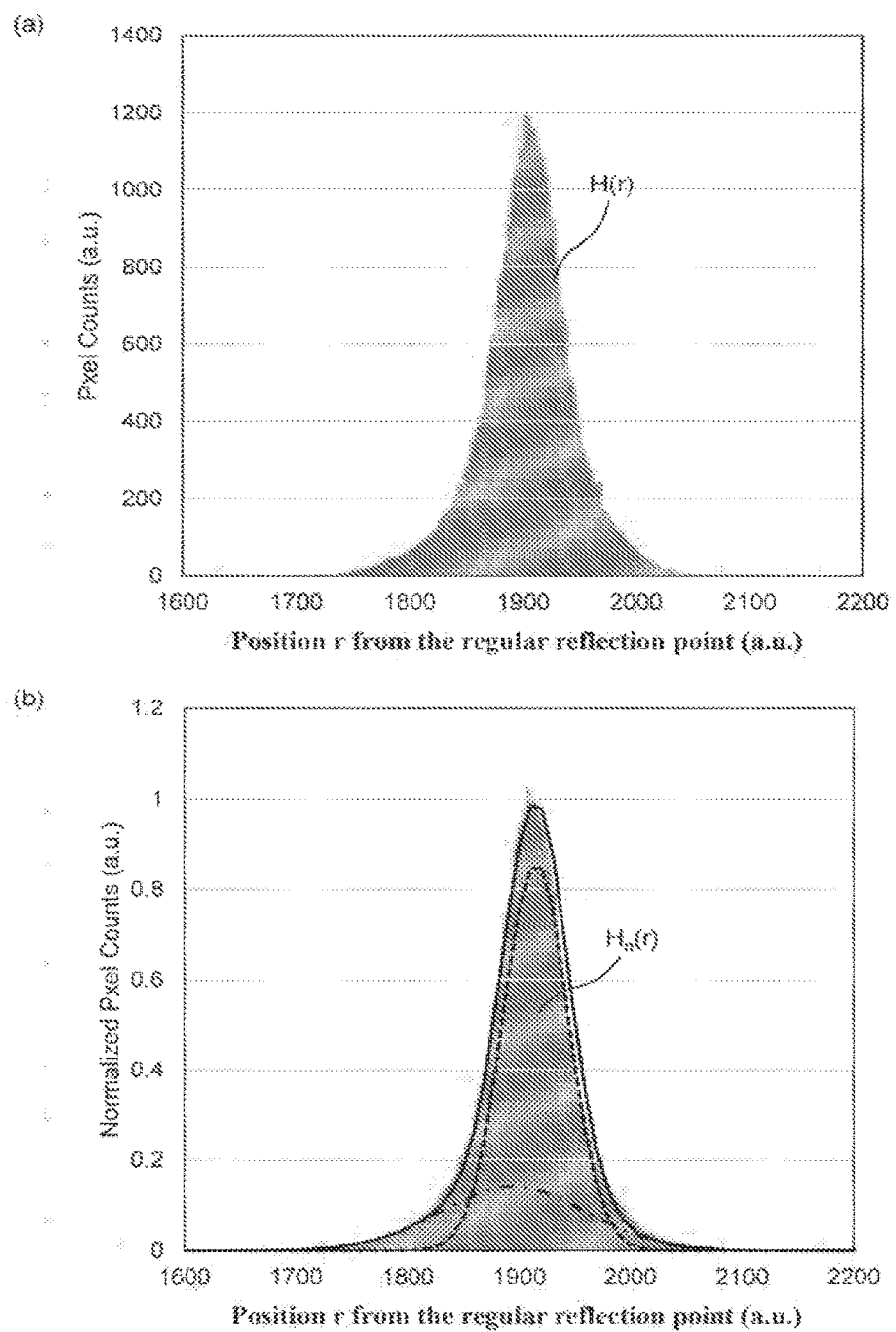

FIG. 7(a) is a diagram illustrating an example of the reflected light distribution obtained by measuring the semiconductor structure. As shown in FIG. 7(a), a reflected light distribution H (r) can be acquired, which is a distribution of an integrated value obtained by integrating intensity of the reflected light measured at a plurality of locations of the semiconductor structure 10, with respect to a position r at the detector 360. The "position r at the detector 360" here means a position (distance) toward the radial direction from the regular reflection point (center of detector 360) at the detector 360. The position r at the detector 360 is called "position r from the regular reflection point". As shown in FIG. 7(a), the reflected light distribution H (r) is acquired as a substantially Gaussian function for the position r from the regular reflection point.

When the reflected light distribution H (r) is acquired, for example, Aq obtained by the following equation (2) is calculated. Aq is defined by the DIN standard (VDA2009), which is a German industry standard, and corresponds to a variance of a normalized reflected light distribution.

$$Aq = k\Sigma(r-M)^2 \cdot H_n(r) \quad (2)$$

Wherein $H_n$ (r) is a distribution obtained by normalizing the reflected light distribution H (r), and is hereinafter referred to as a "normalized reflected light distribution". M is the center of the reflected light distribution, k is a scaling factor, and is set to 1, for example, in this embodiment.

(S116: Parameter Acquisition Step)

Next, the reflected light distribution H (r) of the reference structure 11 obtained in the measurement step S114 is fitted with a predetermined function.

Here, an influence of the curving of the semiconductor structure 10 such as warp and waviness, and an influence of the roughness of the semiconductor structure 10 in the reflected light distribution H (r) of the semiconductor structure 10 will be considered.

Figure 5:
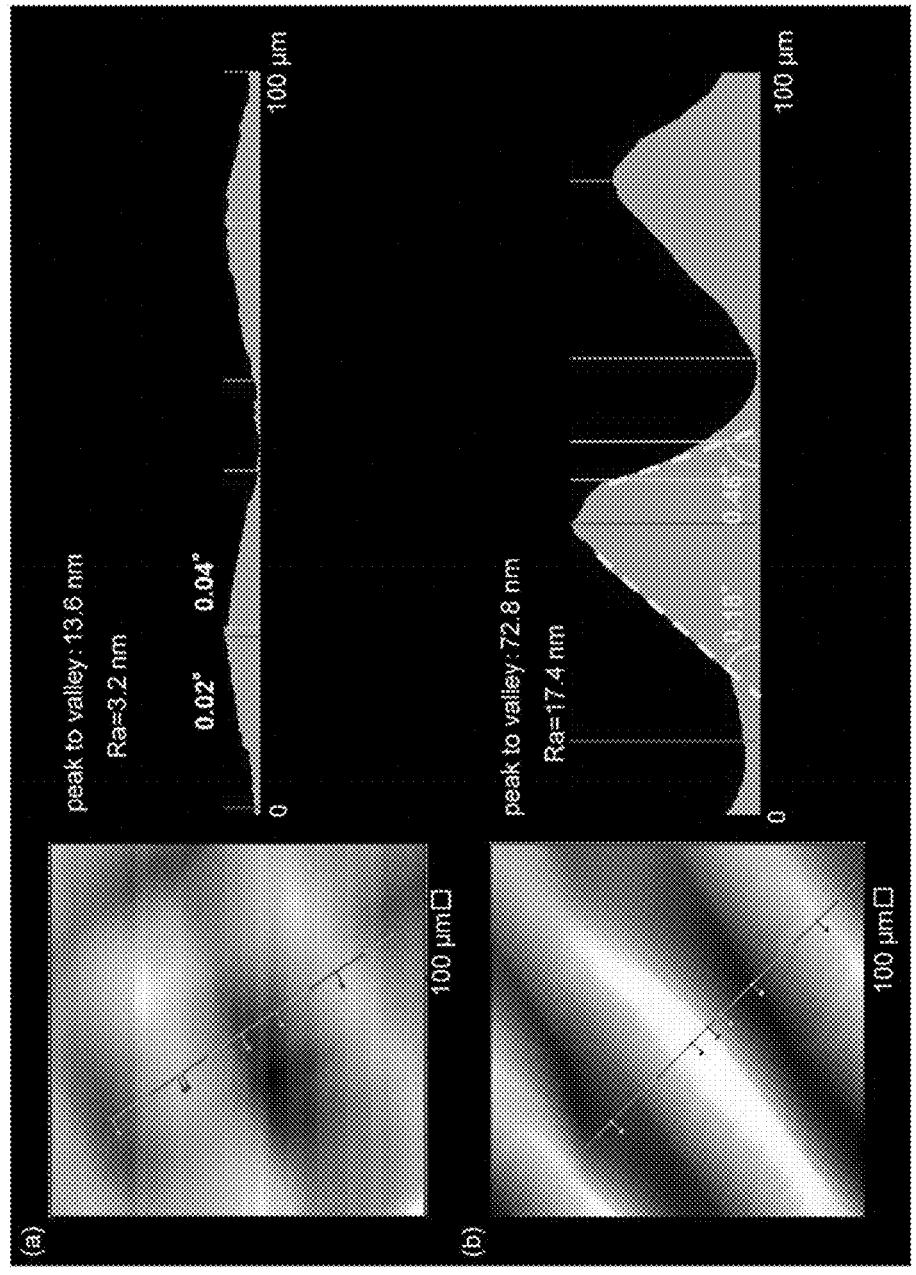
FIG. 5(a) is a diagram illustrating an AFM image of the semiconductor structure having a relatively flat and wavy surface.
FIG. 5(b) is a diagram illustrating an AFM image of the semiconductor structure having a rough surface.

First, with reference to FIG. 5(a) and FIG. 5(b), explanation will be given for the inclination of the surface of the semiconductor structure 10 when the semiconductor structure 10 is wavy and when the semiconductor structure 10 is rough. FIG. 5A is a diagram illustrating an AFM image of the semiconductor structure having a relatively flat and wavy surface, and FIG. 5B is a diagram illustrating an AFM image of the semiconductor structure having a rough surface.

As shown in FIG. 5(a), when the surface roughness was measured by AFM for the semiconductor structure 10 having a relatively flat and wavy surface, irregularities corresponding to the waviness of the semiconductor structure 10 were observed. The inclination of a convex portion corresponding to the waviness of the semiconductor structure 10 was about 0.02° to 0.04°. Also, when the waviness of the semiconductor structure 10 was measured by optical interference type flatness measurement as a separate measurement, it was confirmed that the inclination of the convex portion measured by AFM almost coincided with the inclination calculated from the curvature of the waviness measured by the flatness measurement.

On the other hand, as shown in FIG. 5(b), when the surface roughness was measured b AFM for the semiconductor structure 10 having a rough surface, the inclination of each convex portion corresponding to the roughness of the surface of the semiconductor structure 10 was about 0.18° to 0.46°.

Based on the above results, it was confirmed that the inclination of each convex portion corresponding to the roughness of the surface of the semiconductor structure 10 was larger than the inclination of the convex portion corresponding to the waviness of the semiconductor structure 10. This is also applied to the case of generating the warp in the semiconductor structure 10 in the same manner as the case of generating the waviness in the semiconductor structure 10. That is, it is conceivable that the inclination of each convex portion corresponding to the roughness of the surface of the semiconductor structure 10 is larger than the inclination of the convex portion corresponding to the warp of the semiconductor structure 10.

Figure 6:
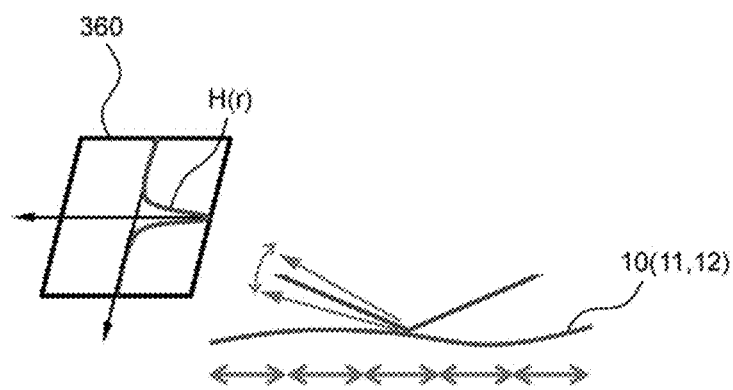
FIG. 6(a) is a schematic diagram illustrating a reflected light distribution when measuring the semiconductor structure having an ideal mirror-like and wavy surface.
FIG. 6(b) is a schematic diagram illustrating a reflected light distribution when measuring the semiconductor structure with ideally no curving and having a rough surface.
Figure 6:
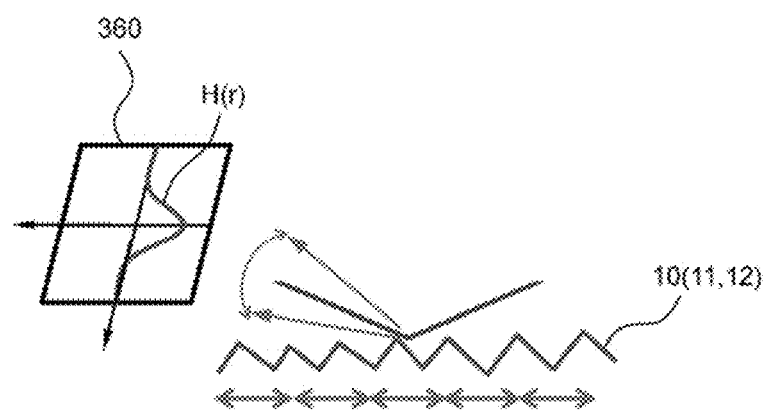

Next, with reference to FIG. 6, explanation will be given for an influence of a curvature such as warp and waviness of the semiconductor structure 10, and an influence of roughness of the semiconductor structure 10, in the reflected light distribution H (r) of the semiconductor structure 10. FIG. 6(a) is a schematic diagram illustrating the reflected light distribution when measuring the semiconductor structure 10 having an ideal mirror-like and wavy surface, and FIG. 6(b) is a schematic diagram illustrating the reflected light distribution when measuring the semiconductor structure with ideally no curving and having a rough surface.

As shown in FIG. 6(a), when the reflected light distribution H (r) of the semiconductor structure 10 having an ideal mirror-like and wavy surface is measured, the light reflected by the surface of the semiconductor structure 10 is scattered at a narrow scattering angle, because the inclination of the convex portion corresponding to the waviness of the semiconductor structure 10 is small. As a result, the reflected light distribution H (r) of the semiconductor structure 10 is a Gaussian distribution distributed over a narrow range.

On the other hand, as shown in FIG. 6(b), when the reflected light distribution H (r) of the semiconductor structure 10 with ideally no curving and having a rough surface is measured, the light reflected by the surface of the semiconductor structure 10 is scattered at a wide scattering angle, because the inclination of each convex portion corresponding to the roughness of the surface of the semiconductor structure 10, is larger than the inclination of the convex portion corresponding to the waviness of the semiconductor structure 10. As a result, the reflected light distribution H (r) of the semiconductor structure 10 is a Gaussian distribution distributed over a wide range.

When the reflected light distribution H (r) of the semiconductor structure 10 which is curved and has a rough surface is measured, the light reflected by the surface of the semiconductor structure 10 is scattered at a narrow scattering angle by the waviness of the semiconductor structure 10, and is scattered at a wide scattering angle by the surface roughness of the semiconductor structure 10. As a result, it is conceivable that the reflected light distribution H (r) of the semiconductor structure 10 is a distribution obtained by superimposing the Gaussian distribution distributed in a narrow range corresponding to the waviness of the semiconductor structure 10 and the Gaussian distribution distributed in a wide range corresponding to the roughness of the surface of the semiconductor structure 10.

Therefore, in the parameter acquisition step S116 of this embodiment, for example, the reflected light distribution H (r) of the reference structure 11 is normalized to obtain a normalized reflected light distribution $H_n$ (r), and the normalized reflected light distribution $H_n$ (r) of the reference structure 11 is fitted by a multiple Gaussian function obtained by adding at least the first Gaussian function and the second Gaussian function distributed more widely than the first Gaussian function. Therefore, the first Gaussian function $f_1$ (r) can reflect the influence of the curving of the semiconductor structure 10, and the second Gaussian function $f_2$ (r) can reflect the influence of the surface roughness of the semiconductor structure 10. At this time, by fitting the normalized reflected light distribution $H_n$ (r) obtained by normalizing the reflected light distribution H (r), fitting results of a plurality of reference structures 11 can be compared, even if there is a variation in the intensity of the light source 340 during measurement of each of the plurality of reference structures 11 in the measurement step S114.

Specifically, for example, as represented by the following equation (1), the normalized reflected light distribution $H_n$ (r) of the reference structure 11 is fitted, by the multiple Gaussian function F (r) obtained by adding two Gaussian functions.

[Formula 2]

$$F(r) = A_1 \exp\left(-\frac{(r-\mu_1)^2}{(2\sigma_1)^2}\right) + A_2 \exp\left(-\frac{(r-\mu_2)^2}{(2\sigma_2)^2}\right) \quad (1)$$

The first term of the multiple Gaussian function F (r) is a first Gaussian function $f_1$ (r), and the second term thereof is a second Gaussian function $f_2$ (r). $A_1$ in the first Gaussian function $f_1$ (r) corresponds to a peak value of the function, and $\sigma_1$ corresponds to the standard deviation of the function. Also, similarly to the first Gaussian function $f_1$ (r), $A_2$ in the second Gaussian function $f_2$ (r) corresponds to the peak value of the function, and $\sigma_2$ corresponds to the standard deviation of the function. Wherein, the standard deviation $\sigma_2$ of the second Gaussian function $f_2$ (r) is larger than the standard deviation $\sigma_1$ of the first Gaussian function $f_1$ (r).

FIG. 7(b) is a diagram illustrating the normalized reflected light distribution and the multiple Gaussian function for fitting this distribution. As shown in FIG. 7(b), the normalized reflected light distribution $H_n$ (r) is fitted using the least square method by the multiple Gaussian function F (r). At this time, in consideration of the second Gaussian function $f_2$ (r), which is more widely distributed than the first Gaussian function $f_1$ (r), it is possible to appropriately fit the distribution particularly in the vicinity of the bottom of the normalized reflected light distribution $H_n$ (r).

As described above, the parameters constituting each of the first Gaussian function $f_1$ (r) and the second Gaussian function $f_2$ (r) are acquired, by fitting the normalized reflected light distribution $H_n$ (r) of the reference structure 11, by the multiple Gaussian function F (r) obtained by adding the first Gaussian function $f_1$ (r) and the second Gaussian function $f_2$ (r).

At this time, since the first Gaussian function $f_1$ (r) reflects the influence of the curving of the reference structure 11, the parameters $A_1$ and $\sigma_1$ of the first Gaussian function $f_1$ (r) are acquired as indexes corresponding to the curving amount of the reference structure 11. Of the parameters of the first Gaussian function $f_1$ (r), $\mu_1$ corresponds to a position of the center of the curving of the reference structure 11.

Further, at this time, since the second Gaussian function $f_2$ (r) reflects the influence of the surface roughness of the reference structure 11, the parameters $A_2$ and $\sigma_2$ of the second Gaussian function $f_2$ (r) are acquired as indexes corresponding to the surface roughness of the reference structure 11. Of the parameters of the second Gaussian function $f_2$ (r), $\mu_2$ means the position of the center of the curving of the reference structure 11, similarly to µ1.

The variance $\sigma_1^2$ of the first Gaussian function $f_1$ (r) can be considered as a first Gaussian function $f_1$ (r) component of Aq described above, and the variance $\sigma_2^2$ of the second Gaussian function $f_2$ (r) can be considered as a second Gaussian function $f_2$ (r) component of Aq described above.
(S118: Correlation Acquisition Step)

Next, in each of the plurality of reference structures 11, at least one of the parameters $A_1$ and $\sigma_1$ of the first Gaussian function $f_1$ (r), and the curving amount of the reference structure 11 (actual values such as warp, waviness, WARP, BOW, and inclined area ratio), are correlated, to acquire "curving correlation". The "curving correlation" can be considered as a calibration curve for obtaining the curving amount of the reference structure 11, from at least one of the parameters $A_1$ and $\sigma_1$ of the first Gaussian function $f_1$ (r).

Figure 10:
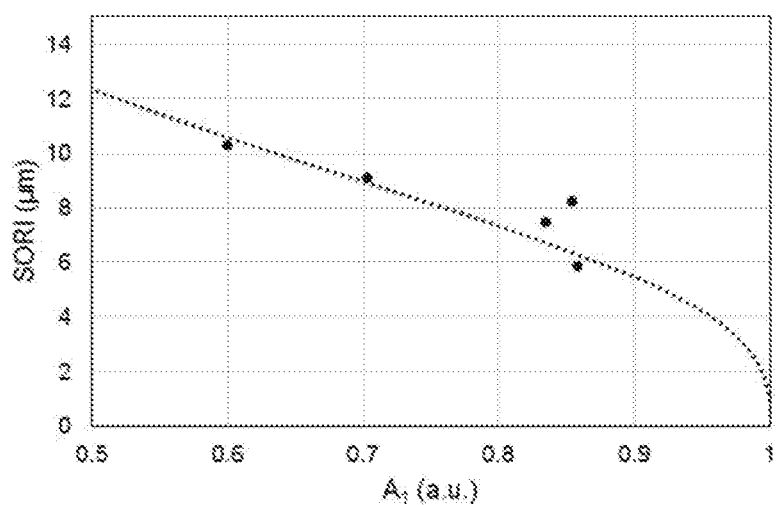
FIG. 10(a) is a diagram illustrating a curving correlation between parameter ($A_1$) of a first Gaussian function and a warp (SORI) of the semiconductor structure.
FIG. 10(b) is a diagram illustrating a roughness correlation between parameter ($\sigma_2$) of a second Gaussian function and a rough area ratio of the semiconductor layer.
Figure 10:
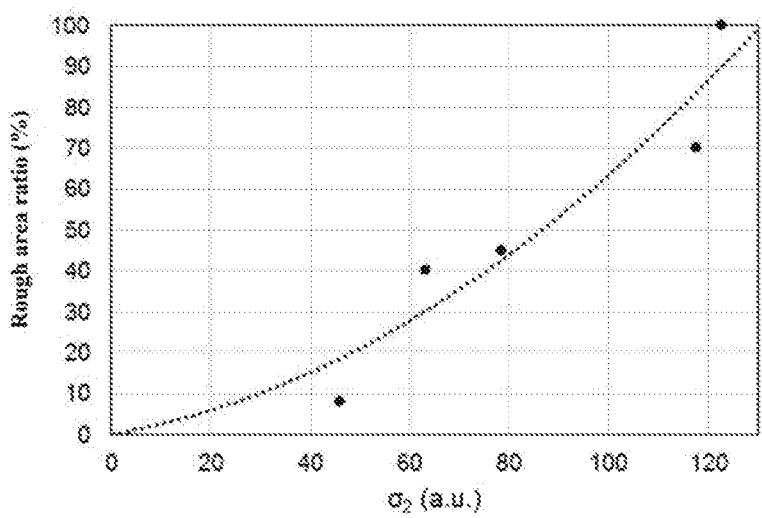

FIG. 10(a) is a diagram illustrating the curving correlation between parameter ($A_1$) of a first Gaussian function and a warp (SORI) of the semiconductor structure. FIG. 10(a) illustrates the curving correlation for reference samples 1 to 5 of examples described later. As shown in FIG. 10(a), for example, the warp (SORI) of the reference structure 11 shows a monotonically decreasing tendency with respect to the parameter $A_1$ of the first Gaussian function $f_1$ (r). Therefore, by fitting the warp of the reference structure 11 with respect to the parameter $A_1$ of the first Gaussian function $f_1$ (r) using a predetermined function by the least square method, the curving correlation indicated by a dotted line is acquired. Therefore, in each of the plurality of reference structures 11, the parameter $A_1$ of the first Gaussian function $f_1$ (r) can be correlated to the warp of the reference structure 11, to acquire the curving correlation.

Further, although not illustrated, for example, the inclined area ratio of the reference structure 11 shows a monotonically increasing tendency with respect to the standard deviation $\sigma_1$ of the first Gaussian function $f_1$ (r). Accordingly, in each of the plurality of reference structures 11, the standard deviation $\sigma_1$ of the first Gaussian function $f_1$ (r) may be correlated to the inclined area ratio of the reference structure 11, to acquire the curving correlation.

Further, in each of the plurality of reference structures 11, at least one of the parameters $A_2$ and $\sigma_2$ of the second Gaussian function $f_2$ (r), and the surface roughness of reference structure 11 (actual value of at least one of the arithmetic mean roughness Ra and the rough area ratio of the semiconductor layer 120, etc.), are correlated, to acquire "roughness correlation". The "roughness correlation" can be considered as a calibration curve for obtaining the surface roughness of the reference structure 11 of the reference structure 11, from at least one of the parameters $A_2$ and $\sigma_2$ of the second Gaussian function $f_2$ (r).

FIG. 10(b) is a diagram illustrating a roughness correlation between parameter ($\sigma_2$) of a second Gaussian function and a rough area ratio of a semiconductor layer. FIG. 10(b) illustrates a roughness correlation for reference samples 1 to 5 of examples described later. As shown in FIG. 10(b), for example, the rough area ratio of the semiconductor layer 120 of the reference structure 11 shows a monotonically increasing tendency with respect to the standard deviation $\sigma_2$ of the second Gaussian function $f_2$ (r). Therefore, by fitting the rough area ratio of the semiconductor layer 120 of the reference structure 11 to the standard deviation $\sigma_2$ of the second Gaussian function $f_2$ (r) by a predetermined function by the least square method, the roughness correlation indicated by the dotted line is acquired. Therefore, in each of the plurality of reference structures 11, the standard deviation $\sigma_2$ of the second Gaussian function $f_2$ (r) can be correlated to the rough area ratio of the reference structure 11, to acquire the roughness correlation.

Further, although not illustrated, for example, the arithmetic mean roughness Ra of the reference structure 11 shows a monotonically decreasing tendency with respect to the parameter $A_2$ of the second Gaussian function $f_2$ (r). Accordingly, in each of the plurality of reference structures 11, the parameter $A_2$ of the second Gaussian function $f_2$ (r) may be correlated to the arithmetic mean roughness Ra of the reference structure 11, to acquire the roughness correlation.

Although not illustrated, for example, the arithmetic mean roughness Ra of the reference structure 11 may show a monotonically increasing tendency with respect to the standard deviation $\sigma_2$ of the second Gaussian function $f_2$ (r). Accordingly, in each of the plurality of reference structures 11, the standard deviation $\sigma_2$ of the second Gaussian function $f_2$ (r) may be correlated to the arithmetic mean roughness Ra of the reference structure 11 to acquire the roughness correlation.

As described above, the curving correlation and the rough correlation are prepared.
(S120: Inspection Structure Preparation Step)

Next, in the inspection structure preparation step S120, the inspection structure 12 as the semiconductor structure 10 to be inspected is prepared in substantially the same manner as in the reference structure preparation step S112.

Specifically, as shown in FIG. 1, for example, an n-type GaN free-standing substrate is prepared as the substrate 100. Next, the semiconductor layer 120 made of, for example, n-type GaN and having a thickness of 20 μm is formed on the substrate 100 by the MOVPE method. Thereby, the inspection structure 12 having the substrate 100 and the semiconductor layer 120 is produced.

At this time, from a viewpoint of applying the correlation acquired from the plurality of reference structures 11 in the above-described correlation preparation step S110 to the inspection of the inspection structure 12, conditions such as a state of the substrate 100 and the growth conditions of the semiconductor layer 120 when producing the inspection structure 12, are set or adjusted to predetermined optimum conditions in which the curving and the surface roughness are each reduced.
(S130: Inspection Step)

Next, in the inspection step S130, the inspection structure 12 is inspected. The inspection step S130 of this embodiment includes, for example, a measurement step S132, a parameter acquisition step S131, and a calculation step S136.
(S132: Measurement Step)

Measurement of the reflected light distribution is performed for the inspection structure 12 using the inspection device 30 in the same manner as in the measurement step S114 for the reference structure 11. At this time, the measurement step S132 is performed for the inspection structure 12 under the same measurement conditions as the measurement conditions in the measurement step S124 performed for the plurality of reference structures 11, to acquire the reflected light distribution H (r) of the inspection structure 12. When the reflected light distribution H (r) is acquired, for example, Aq obtained by the above equation (2) is calculated.
(S134: Parameter Acquisition Step)

Next, the reflected light distribution H (r) of the inspection structure 12 obtained in the measurement step S132 is fitted in the same manner as in the parameter acquisition step S116 for the reference structure 11. Specifically, the reflected light distribution H (r) of the inspection structure 12 is normalized to obtain a normalized reflected light distribution $H_n$ (r), and the normalized reflected light distribution Hn (r) of the inspection structure 12 is fitted by the multiple Gaussian function F (r) obtained by adding two Gaussian functions as represented by the above equation (1). Thereby, parameters constituting each of the first Gaussian function $f_1$ (r) and the second Gaussian function $f_2$ (r) are acquired.

At this time, since the first Gaussian function $f_1$ (r) reflects the influence of the curving of the inspection structure 12, the parameters $A_1$ and $\sigma_1$ of the first Gaussian function $f_1$ (r) are acquired as indexes corresponding to the curving amount of the inspection structure 12.

Further, at this time, since the second Gaussian function $f_2$ (r) reflects the influence of surface roughness of the inspection structure 12, the parameters $A_2$ and $\sigma_2$ of the second Gaussian function $f_2$ (r) are acquired as indexes corresponding to the surface roughness of the inspection structure 12.

(S136: Calculation Step)

Next, a least one of the parameters $A_1$ and $\sigma_1$ of the first Gaussian function $f_1$ (r) acquired in the parameter acquisition step S134 for the inspection structure 12, is applied to the curving correlation prepared in the correlation preparation step S110, to calculate the curving amount of the inspection structure 12.

Specifically, for example, parameter $A_1$ of the first Gaussian function $f_1$ (r) acquired in the parameter acquisition step S134 for the inspection structure 12, is applied to the curving correlation indicated by the dotted line in FIG. 10(a), to calculate the warp of the inspection structure 12. Alternatively, for example, standard deviation $\sigma_1$ of the first Gaussian function $f_1$ (r) acquired in the parameter acquisition step S134 for the inspection structure 12, may be applied to the curving correlation not shown, to calculate the inclined area ratio of the inspection structure 12.

Further, at least one of the parameters $A_2$ and $\sigma_2$ of the second Gaussian function $f_2$ (r) acquired in the parameter acquisition step S134 for the inspection structure 12, is applied to the roughness correlation prepared in the correlation preparation step S110, to calculate the surface roughness of the inspection structure 12.

Specifically, for example, standard deviation $\sigma_2$ of the second Gaussian function $f_2$ (r) acquired in the parameter acquisition step S134 for the inspection structure 12, may be applied to the roughness correlation indicated by the dotted line in FIG. 10(b), to calculate the rough area ratio of the inspection structure 12. Alternatively, for example, parameter $A_2$ and standard deviation $\sigma_2$ of the second Gaussian function $f_2$ (r) acquired in the parameter acquisition step S134 for the inspection structure 12, may be applied to the roughness correlation not shown, to calculate the arithmetic mean roughness Ra of inspection structure 12.

As described above, by inspecting the inspection structure 12, the curving amount and the surface roughness of the inspection structure 12 are obtained.

(S140: Selecting Step)

Next, based on at least one of the parameters $A_1$ and $\sigma_1$ of the first Gaussian function $f_1$ (r) and the parameters $A_2$ and $\sigma_2$ of the second Gaussian function $f_2$ (r), as parameters acquired in the parameter acquisition step S134 for the inspection structure 12, the quality of the inspection structure 12 is determined, and the inspection structure 12 is selected.

In this embodiment, based on at least one of the parameters $A_1$ and $\sigma_1$ of the first Gaussian function $f_1$ (r) and the parameters $A_2$ and $\sigma_2$ of the second Gaussian function $f_2$ (r), at least one of the curving amount and the surface roughness of the inspection structure 12 is calculated in the above calculation step S136. Therefore, in the selecting step S140 of this embodiment, the inspection structure 12 is selected based on at least one of the curving amount and the surface roughness of the inspection structure 12.

Specifically, for example, based on the warp of the inspection structure 12 calculated in the calculation step S136, when the warp of the inspection structure 12 exceeds 50 μm, the inspection structure 12 is excluded as a defective product, and on the other hand, when the warp of the inspection structure 12 is 50 μm or less, the inspection structure 12 is selected as a non-defective product. When the warp of the inspection structure 12 is 20 μm or less, the inspection structure 12 may be selected as the best product.

Further, for example, based on the inclined area ratio of the inspection structure 12 calculated in the calculation step S136, when the inclined area ratio of the inspection structure 12 is more than 80%, the inspection structure 12 is excluded as a defective product, and on the other hand, when the inclined area ratio of the inspection structure 12 is 80% or less, the inspection structure 12 is selected as a non-defective product. When the inclined area ratio of the inspection structure 12 is 50% or less, the inspection structure 12 may be selected as the best product.

As described above, since the inspection structure 12 is selected based on the warp and the inclined area ratio of the inspection structure 12, defocusing can be suppressed in the photolithography step, and the occurrence of pattern defects can be suppressed, in the inspection structure 12 selected as a non-defective product.

Further, for example, based on the rough area ratio of the inspection structure 12 calculated in the calculation step S136, when the rough area ratio of the inspection structure 12 is more than 50%, the inspection structure 12 is excluded as a defective product, and on the other hand, when the rough area ratio of the inspection structure 12 is 50% or less, the inspection structure 12 is selected as a non-defective product. When the rough area ratio of the inspection structure 12 is 20% or less, the inspection structure 12 may be selected as the best product.

Further, for example, based on the arithmetic mean roughness Ra of the inspection structure 12 calculated in the calculation step S136, when the arithmetic mean roughness Ra of the inspection structure 12 is more than 30 nm, the inspection structure 12 is excluded as a defective product, and on the other hand, when the arithmetic mean roughness Ra of the inspection structure 12 is 30 nm or less, the inspection structure 12 is selected as a non-defective product. When the arithmetic mean roughness Ra of the inspection structure 12 is 15 nm or less, the inspection structure 12 may be selected as the best product.

As described above, since the inspection structure 12 is selected based on the rough area ratio or the arithmetic mean roughness Ra of the inspection structure 12, a high yield can be ensured in the inspection structure 12 selected as a non-defective product by setting 10% or less ratio of the semiconductor device not satisfying a design withstand voltage during reverse bias application.

As described above, the inspection structure 12 is manufactured.

When manufacturing a plurality of inspection structures 12, the steps from the inspection structure preparation step S120 to the selecting step S140 are repeated.

(4) Effects Obtained by This Embodiment

According to this embodiment, one or more of the following effects can be obtained.

(a) The reflected light distribution H (r) of the semiconductor structure 10 (in this embodiment, for example, the normalized reflected light distribution $H_n$ (r)) is fitted by the multiple Gaussian function F (r) obtained by adding at least the first Gaussian function $f_1$ (r) and the second Gaussian function $f_2$ (r) distributed more widely than the first Gaussian function $f_1$ (r). Therefore, the first Gaussian function $f_1$ (r) can reflect the influence of the curving of the semiconductor structure 10, and the second Gaussian function $f_2$ (r) can reflect the influence of surface roughness of the semiconductor structure 10. That is, the influence of the curving of the semiconductor structure 10 and the influence of the surface roughness of the semiconductor structure 10 can be separated in the reflected light distribution H (r) of the semiconductor structure 10.

(b) in the reflected light distribution H (r) of the semiconductor structure 10, the influence of the curving of the semiconductor structure 10 and the influence of the surface roughness of the semiconductor structure 10 are separated. Therefore, the parameter of the first Gaussian function $f_1$ (r) can be correlated to the curving amount of the semiconductor structure 10 with high accuracy, and the parameter of the second Gaussian function $f_2$ (r) can be correlated to the surface roughness of the semiconductor structure 10 with high accuracy. As a result, the quality of the semiconductor structure 10 can be appropriately managed by the parameter of the first Gaussian function $f_1$ (r) or the parameter of the second Gaussian function $f_2$ (r).

In this embodiment, since the quality of the semiconductor structure 10 is managed by both the parameter of the first Gaussian function $f_1$ (r) and the parameter of the second Gaussian function $f_2$ (r), the accuracy for managing the quality can be improved.

(c) The reflected light distribution H (r) of the semiconductor structure 10 can be measured nondestructively and at high speed by an inspection device 30. Therefore, measurement of the curving and the surface roughness can be performed easily with high accuracy, for the entire surface of the semiconductor structure 10 and/or for the total number of the semiconductor structures 10. As a result, a defective semiconductor structure 10 can be reliably detected.

As described above, since the conventional contact-type measurement of the surface roughness is time-consuming, it is difficult to perform the contact-type measurement for the entire surface of the semiconductor structure and/or for the total number of semiconductor structures. In contrast, in this embodiment, since the reflected light distribution H (r) of the semiconductor structure 10 is measured nondestructively and at high speed by the inspection device 30, measurement of the surface roughness can be easily performed for the entire surface of the semiconductor structure 10 and/or for the total number of the semiconductor structures 10 with the same accuracy as the contact-type measurement.

(d) When the reflected light distribution H (r) of the semiconductor structure 10 is measured, both the parameter of the first Gaussian function $f_1$ (r) as an index corresponding to the curving amount of the semiconductor structure 10, and the parameter of the second Gaussian function $f_2$ (r) as an index corresponding to the surface roughness of the semiconductor structure 10, can be acquired by fitting of the multiple Gaussian function F (r) Therefore, the time required for the inspection step S130 of the semiconductor structure 10 can be shortened, compared to the case where the measurement of the curving amount of the semiconductor structure 10 and the measurement of the surface roughness of the semiconductor structure 10 are performed separately.

(e) In the selecting step S140, the quality of the semiconductor structure 10 is determined based on the parameter of the first Gaussian function $f_1$ (r) as an index corresponding to the curving amount of the semiconductor structure 10, or the parameter of the second Gaussian function $f_2$ (r) as an index corresponding to the surface roughness of the semiconductor structure 10, then the semiconductor structure 10 is selected. Therefore, the non-defective semiconductor structure 10 having a small curving amount or a small surface roughness can be selected, and outflow of the defective semiconductor structure 10 having a large curving amount or a large surface roughness can be avoided.

Specifically, since the semiconductor structure 10 is selected based on the parameter of the first Gaussian function $f_1$ (r) as an index corresponding to the curving amount of the semiconductor structure 10, defocusing can be suppressed in the photolithography step, and the occurrence of pattern defects can be suppressed in the inspection structure 12 selected as a non-defective product Further, since the semiconductor structure 10 is selected based on the parameter of the second Gaussian function $f_2$ (r) as an index corresponding to the surface roughness of the semiconductor structure 10, a high yield can be ensured by setting 10% or less ratio of the semiconductor device not satisfying a design withstand voltage during reverse bias application.

As described above, since the semiconductor structure 10 is selected based on the parameter obtained by fitting the reflected light distribution H (r) of the semiconductor structure 10, the yield in post-step and device reliability are predicted at a manufacturing stage of the semiconductor structure 10, and the quality of the semiconductor structure 10 can be appropriately managed.

(f) The correlation preparation step S110 includes: preparing the roughness correlation in which the parameter of the second Gaussian function $f_2$ (r) is correlated to the surface roughness of the semiconductor structure 10, and the inspection step S130 includes: applying the parameter of the second Gaussian function $f_2$ (r) acquired in the parameter acquisition step S134 to the roughness correlation, to calculate the surface roughness of the semiconductor structure 10. That is, when the roughness correlation is prepared in advance, since the parameter f the second Gaussian function $f_2$ (r) is applied to the roughness correlation, specific surface roughness can be obtained without performing time-consuming contact-type measurement of the surface roughness.

Further, the correlation preparation step S110 includes: preparing the curving correlation relationship in which the parameter of the first Gaussian function $f_1$ (r) is correlated to the curving amount of the semiconductor structure 10, and the inspection step S130 includes: applying the parameters of the first Gaussian function $f_1$ (r) acquired in the parameter acquisition step S134 to the curving correlation, to calculate the curving amount of the semiconductor structure 10. That is, when the curving correlation is prepared in advance, since the parameter of the first Gaussian function $f_1$ (r) is applied to the curving correlation, specific curving amount can be obtained without performing another measurement of the curving amount.

As described above, since a specific physical quantity is obtained by applying the parameter obtained by fitting the reflected light distribution H (r) of the semiconductor structure 10 to a predetermined correlation, the quality of the semiconductor structure 10 can be easily grasped based on the physical quantity. As a result, the quality of the semiconductor structure 10 can be easily managed.

(5) Modified Example of This Embodiment

In the above-described embodiment, explanation is given for a case in which a predetermined correlation is prepared in advance before the inspection step S130. However, as in the modified example shown below, it is not necessary to prepare the predetermined correlation.

(1) Method for Manufacturing a Semiconductor Structure

Figure 8:
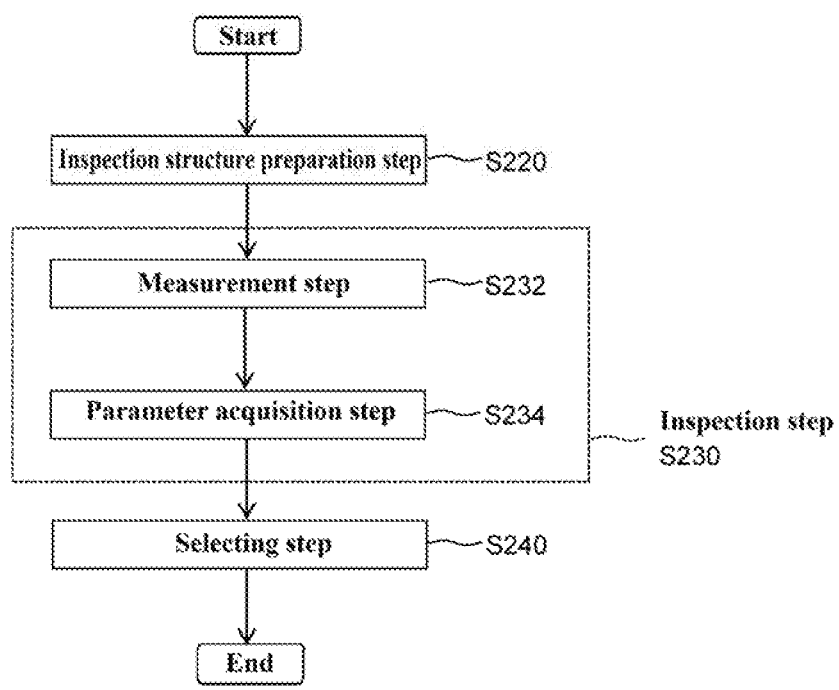
FIG. 8 is a flowchart illustrating a method for manufacturing a semiconductor structure according to a modified example of an embodiment of the present invention.

With reference to FIG. 8, a method for manufacturing a semiconductor structure according to a modified example will be described. FIG. 8 is a flowchart illustrating a method for manufacturing a semiconductor structure according to a modified example of this embodiment. Hereinafter, only elements different from the above-described embodiment will be described, and elements substantially the same as those described in the above-described embodiment will be denoted by the same reference numerals and description thereof will be omitted.

(S220: Inspection Structure Preparation Step)

In this modified example, in the inspection structure preparation step S220, the inspection structure 12 as the semiconductor structure 10 to be inspected is prepared, without performing the correlation preparation step. At this time, conditions such as the state of the substrate 100 and the growth conditions of the semiconductor layer 120 when producing the inspection structure 12 are set or adjusted to predetermined optimum conditions.

(S230: Inspection Step)

Next, the inspection step S230 includes: inspecting the inspection structure 12. The inspection step S230 of the modified example further includes: for example, a measurement step S232 and a parameter acquisition step S234.

(S232: Measurement Step)

The reflected light distribution is measured for the inspection structure 12 using the inspection device 30, to acquire the reflected light distribution H (r) of the inspection structure 12.

(S234: Parameter Acquisition Step)

Next, the reflected light distribution H (r) of the inspection structure 12 is normalized to obtain a normalized reflected light distribution $H_n$ (r), and the normalized reflected light distribution $H_n$ (r) of the inspection structure 12 is fitted by multiple Gaussian function f (r) obtained by adding two Gaussian functions represented by the above equation (1).

At this time, since the first Gaussian function $f_1$ (r) reflects the influence of the curving of the inspection structure 12, the parameters $A_1$ and $\sigma_1$ of the first Gaussian function $f_1$ (r) are acquired as indexes corresponding to the curving amount of the inspection structure 12.

Further, at this time, since the second Gaussian function $f_2$ (r) reflects the influence of surface roughness of the inspection structure 12, the parameters $A_2$ and $\sigma_2$ of the second Gaussian function $f_2$ (r) are acquired as indexes corresponding to the surface roughness of the inspection structure 12.

In this modified example, the inspection step S230 is ended in the parameter acquisition step S234, and the calculation step for calculating the curving amount and the surface roughness is not performed.

(S240: Selecting Step)

Next, the quality of the inspection structure 12 is determined, and the inspection structure 12 is selected, based on at least one of the parameters $A_1$ and $\sigma_1$ of the first Gaussian function $f_1$ (r) and the parameters $A_2$ and $\sigma_2$ of the second Gaussian function $f_2$ (r), as parameters for the inspection structure 12 acquired in the parameter acquisition step S234.

Specifically, for example, based on the parameter $A_1$ of the first Gaussian function $f_1$ (r), when satisfying $A_1 < 0.5$, the inspection structure 12 is selected as a non-best product, and on the other hand, when satisfying $0.5 \leq A_1 \leq 1$, the inspection structure 12 is selected as the best product. The above selection corresponds to selecting the inspection structure 12 having a warp of more than 20 μm as a non-best product, and on the other hand, selecting the inspection structure 12 having a warp of 20 μm or less as the best product.

Further, for example, based on the standard deviation $\sigma_2$ of the second Gaussian function $f_2$ (r), when satisfying $\sigma_2 > 90$, the inspection structure 12 is excluded as a defective product, and on the other hand, when satisfying $\sigma_2 \leq 90$, the inspection structure 12 is selected as a non-defective product. The above selection corresponds to excluding the inspection structure 12 having the rough area ratio of more than 50% as a defective product, and on the other hand, selecting the inspection structure 12 having the rough area ratio of 50% or less as a non-defective product. When satisfying $\sigma 2 \leq 50$, the inspection structure 12 may be selected as the best product. The above selection corresponds to selecting the inspection structure 12 having the rough area ratio of 20% or less as the best product.

As described above, the inspection structure 12 is manufactured.

(2.) Effects Obtained by This Embodiment

As in this modified example, the semiconductor structure 10 may be selected, based on the parameter of the first Gaussian function $f_1$ (r) as an index corresponding to the curving amount of the semiconductor structure 10, or the parameter of the second Gaussian function $f_2$ (r) as an index corresponding to the surface roughness of the semiconductor structure 10. Therefore, the quality of the semiconductor structure 10 can be easily determined, without performing another measurement to measure an actual value of the curving amount or the surface roughness, or calculating the curving amount or the surface roughness by applying the parameter to the correlation. That is, since the correlation preparation step and the calculation step can be eliminated, the manufacturing step of the semiconductor structure 10 can be simplified.

<Other Embodiments>

As described above, the embodiment of the present invention has been specifically described. However, the present invention is not limited to the above-described embodiment, and various modifications can be made without departing from the scope of the invention.

In the above-described embodiment, explanation has been given for a case where the semiconductor structure 10 is configured as a semiconductor laminate that is a precursor for manufacturing SBD. However, the semiconductor structure 10 may be configured as, for example, a semiconductor laminate which is a precursor when manufacturing a semiconductor device having a configuration other than the configuration of the above embodiment, a free-standing substrate made of a single semiconductor, a template having a predetermined support substrate and a semiconductor layer on the support substrate, or the like.

In the above-described embodiment, explanation has been given for a case where the light source 340 of the inspection device 30 is a laser diode. However, the light source 340 may be a light emitting diode, for example.

In the above-described embodiment, explanation has been given for a case where a plurality of reference structures 11 are produced and correlation is acquired based on the measurement result, in the correlation preparation step S110. However, when the predetermined correlation is acquired by a theoretical formula or the like, the reference structure 11 need not be produced.

In the above-described embodiment, explanation has been given for a case where the parameter $A_1$ of the first Gaussian function $f_1$ (r) is correlated to the warp of the reference structure 11, and the standard deviation $\sigma_1$ of the first Gaussian function $f_1$ (r) is correlated to the inclined area ratio of the reference structure 11, to acquire the curving correlation, in the correlation preparation step S110. On the contrary, it is acceptable that the standard deviation $\sigma_1$ of the first Gaussian function $f_1$ (r) is correlated to the warp of the reference structure 11, and the parameter $A_1$ of the first Gaussian function $f_1$ (r) is correlated to the inclined area ratio of the reference structure 11, to acquire the curving correlation. It is also acceptable that at least one of the parameters $A_1$ and of the first Gaussian function $f_1$ (r) is correlated to other curving amount (actual values of waviness, WARP, BOW, etc.) of the reference structure 11, to acquire the curving correlation.

In the above-described embodiment, explanation has been given for a case where the standard deviation $\sigma_2$ of the second Gaussian function $f_2$ (r) is correlated to the rough area ratio of the reference structure 11 or the arithmetic mean roughness Ra of the reference structure 11, to acquire the roughness correlation, in the correlation preparation step S110. However, it is acceptable that the parameter $A_2$ of the second Gaussian function $f_2$ (r) is correlated to the rough area ratio of the reference structure 11 or the arithmetic mean roughness Ra of the reference structure 11, to acquire the roughness correlation. Further, at least one of the parameters $A_2$ and $\sigma_2$ of the second Gaussian function $f_2$ (r) is correlated to other surface roughness of the reference structure 11 (actual values such as root mean square roughness Rq (RMS), root mean square slope Rdq, etc.), to acquire the roughness correlation.

In the above-described embodiment, explanation has been given for a case where the multiple Gaussian function F (r) used for fitting is the function obtained by adding two Gaussian functions in the parameter acquisition steps S116, S134, S234. However, the multiple Gaussian function F (r) used in this step may be the function obtained by adding three or more Gaussian functions. Wherein, the Gaussian function having a standard deviation larger than the standard deviation $\sigma_2$ of the second Gaussian function $f_2$ (r) corresponds to the influence of a noise in the reflected light distribution, and therefore such a Gaussian function may be ignored.

In the above-described embodiment, explanation has been given for a case where both the parameters of the first Gaussian function $f_1$ (r) and the second Gaussian function $f_2$ (r) are acquired in parameter acquisition steps S134 and S234, and the inspection structure 12 is selected based on both the parameters of the first Gaussian function $f_1$ (r) and the second. Gaussian function $f_2$ (r) in the selecting steps S140 and S240. However, it is acceptable that only one of the parameters of the first Gaussian function $f_1$ (r) or the second Gaussian function $f_2$ (r) is acquired in the parameter acquisition steps S134 and S234, and the inspection structure 12 is selected based on only the acquired parameter in the selecting steps S140 and 240.

In the above-described embodiment, explanation has been given for a case where the parameters of the first Gaussian function $f_1$ (r) and the parameter of the second Gaussian function $f_2$ (r) are respectively applied to a predetermined correlation, to calculate the curving amount and the surface roughness in the calculation step S136. However, it is also acceptable that only one of the parameter of the first Gaussian function $f_1$ (r) or the parameter of the second Gaussian function $f_2$ (r) is applied to a predetermined correlation, to calculate only one of the curving amount or the surface roughness.

In the above-described embodiment, explanation has been given for a case where the selecting step S140 for selecting the inspection structure 12 is performed. However, if the purpose is only to store the parameter of the first Gaussian function $f_1$ (r), the parameter of the second Gaussian function $f_2$ (r), and the curving amount or the surface roughness calculated from them, the selecting step can be eliminated.

Example

Hereinafter, various experimental results supporting the effect of the present invention will be described.

(1) Preparation of Correlation
(1-1) Preparation of Reference Sample

Semiconductor structures of reference samples 1 to 5 were produced as SBD precursors. Specifically, first, n-type GaN free-standing substrates were prepared as five substrates. The five substrates have different surface states. Further, a diameter of each substrate was 2 inches, a thickness of each substrate was 400 μm, and Si concentration of each substrate was $2\times10^{18}$ cm$^{-3}$. Next, a semiconductor layer made of n-type GaN was formed on the substrate by the MOVPE method. At this time, the same growth conditions were applied to each of the five substrates. Further, the Si concentration of the semiconductor layer was $5\times10^{15}$ cm$^{-3}$ and the thickness of the semiconductor layer was 20 μm. Thus, reference samples 1 to 5 were produced.

(1-2) Measurement of Reference Samples

Next, the following measurements were performed for each of the reference samples 1 to 5.

The warp (SORI) of each of the reference samples 1 to 5 was measured using an optical interference type flatness measuring device, FlatMaster manufactured by Corning Tropel was used as the flatness measuring device.

The main surface of each semiconductor layer of the reference samples 1 to 5 was observed using a Nomarski microscope, to measure the rough area ratio of each of reference samples 1 to 5.

The reflected light distribution was measured for each of the reference samples 1 to 5. Candela CS920 manufactured by KLA Tencor was used for the measurement of the reflected light distribution.

(1-3) Measurement Result of the Reference Samples

Table 1 below shows the SORI and the rough area ratio of each of the reference samples 1 to 5.

TABLE 1

|  | Reference sample 1 | Reference sample 2 | Reference sample 3 | Reference sample 4 | Reference sample 5 |
| --- | --- | --- | --- | --- | --- |
| $A_1$ | 0.858 | 0.855 | 0.835 | 0.703 | 0.600 |
| $A_2$ | 0.142 | 0.145 | 0.165 | 0.297 | 0.400 |
| $\mu_1$ | 1915 | 1915 | 1895 | 1895 | 1890 |
| $\mu_2$ | 1895 | 1910 | 1895 | 1895 | 1900 |
| $\sigma_1$ | 20.7 | 17.9 | 22.6 | 20 | 50 |
| $\sigma_2$ | 45.8 | 63.2 | 78.4 | 117.5 | 122.5 |
| SORI (μm) | 5.85 | 8.21 | 7.46 | 9.07 | 10.27 |

TABLE 1-continued

| | Reference sample 1 | Reference sample 2 | Reference sample 3 | Reference sample 4 | Reference sample 5 |
|---|---|---|---|---|---|
| Rough area ratio (%) | 7.8 | 40 | 45 | 70 | 100 |

As shown in Table 1, in the reference samples 1 to 5, the SORI and the rough area ratio differed depending on the surface state of the substrate.

Figure 9:
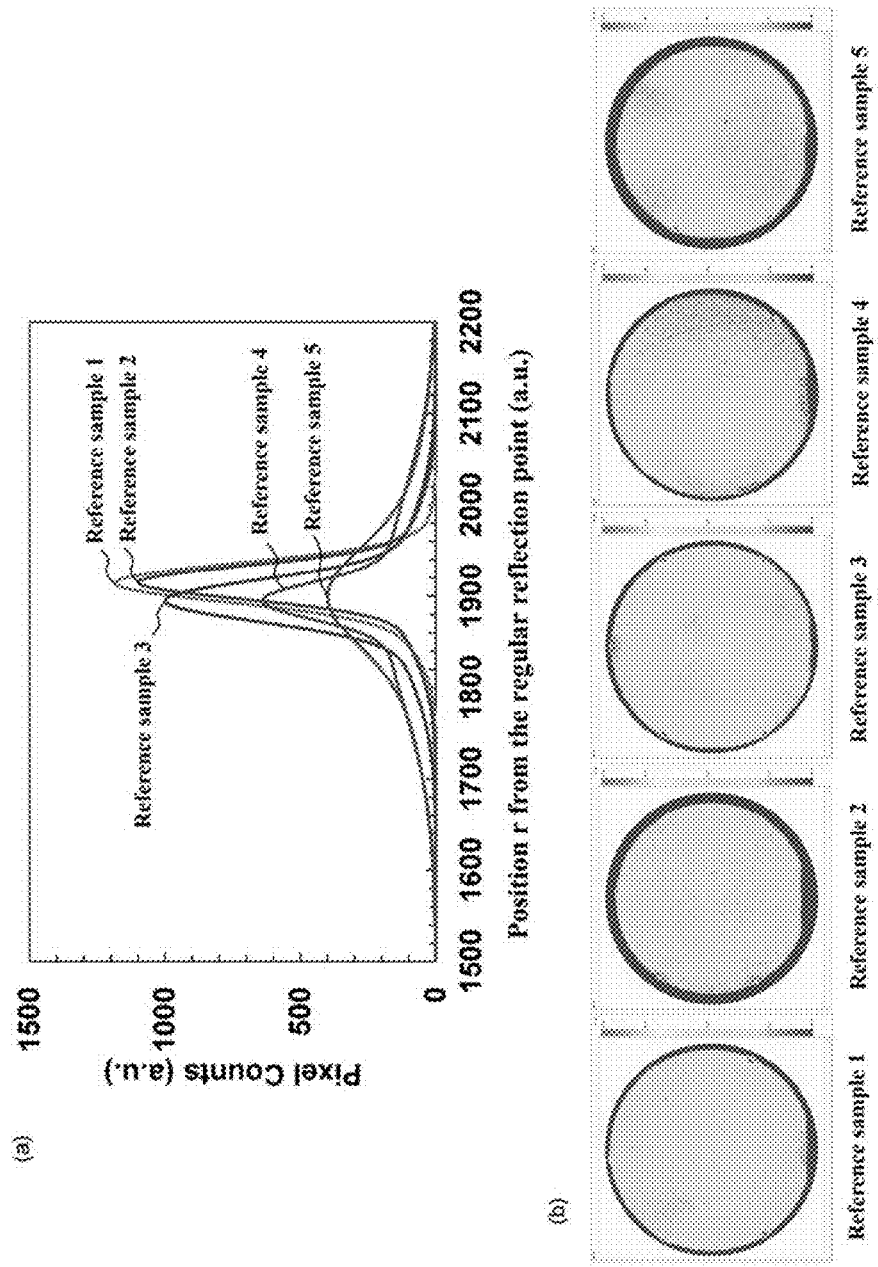
FIG. 9(a) is a diagram illustrating the reflected light distributions of reference samples 1 to 5.
FIG. 9(b) is a diagram illustrating in-plane distributions of reflected light intensity of reference samples 1 to 5.

Further, FIG. 9(a) is a diagram illustrating the reflected light distribution of the reference samples 1 to 5, and FIG. 9(b) is a diagram illustrating the in-plane distribution of the reflected light intensity of the reference samples 1 to 5. The in-plane distribution of the reflected light intensity is the distribution of the reflected light intensity in the surface of the semiconductor structure.

As shown in FIG. 9(a) and FIG. 9(b), in each of the reference samples 1 to 5, the reflected light distribution and the in-plane distribution of the reflected light intensity differed according to the curving and the roughness. In FIG. 9(b), a laser reflection position from a regular reflection point obtained by measurement at each point on the wafer is displayed as average information for each 50 μm square.

(1-4) Acquisition of Parameters of the Reference Samples

The reflected light distribution of each of the reference samples 1 to 5 illustrated in FIG. 9(a) was normalized to obtain a normalized reflected light distribution, and the normalized reflected light distribution was fitted by the multiple Gaussian function F (r) represented by the above formula (1). Thereby, parameters constituting each of the first Gaussian function $f_1$ (r) and the second Gaussian function $f_2$ (r) were obtained. The parameters constituting each of the first Gaussian function $f_1$ (r) and the second Gaussian function $f_2$ (r) in the reference samples 1 to 5 are shown in the above Table 1.

(1-5) Acquisition of Correlation

As shown in FIG. 10(a), the warp of the reference samples 1 to 5 showed a monotonically decreasing tendency with respect to the parameter $A_1$ of the first Gaussian function $f_1$ (r). Therefore, the warp of the semiconductor structure with respect to the parameter $A_1$ of the first Gaussian function $f_1$ (r) was fitted by a predetermined function by the method of least squares, to acquire the curving correlation indicated by dotted line.

At this time, the following equation (3) was obtained as the curving correlation.

$$SORI = 11.7(1-A_1)^{0.35}/A_1^{0.43} \quad (3)$$

At this time, the following equation (3)' was also obtained as a curving correlation, wherein y=$A_1$ and x=SORI.

$$y = 1.992 \times 10^{-5} x^4 - 1.941 \times 10^{-4} x^3 - 4.736 \times 10^{-3} x^2 + 1.072 \times 10^{-2} x + 9.956 \times 10^{-1} \quad (3)'$$

Further, as shown in FIG. 10(b), the rough area ratio of the reference samples 1 to 5 showed a monotonically increasing tendency with respect to the standard deviation $\sigma_2$ of the second Gaussian function $f_2$ (r). Therefore, the rough area ratio of the semiconductor structure with respect to the standard deviation $\sigma_2$ of the second Gaussian function $f_2$ (r) was fitted by a predetermined function by the method of least squares, to acquire the roughness correlation indicated by dotted line. At this time, the following formula (4) was obtained as the roughness correlation.

$$(\text{Rough area ratio}) = 0.0043 \sigma_2^2 + 0.2058 \sigma_2 \quad (4)$$

(2) Inspection of Samples (2-1) Preparation of Inspection Sample

As an example, under the same conditions as in the reference sample 1, the semiconductor structure of an inspection sample was produced.

(2-2) Measurement of the Inspection Sample

Under the same measurement conditions as those of the reference samples 1 to 5, the reflected light distribution was measured for the inspection sample.

(2-3) Acquisition of Parameters of the Inspection Sample

The reflected light distribution of the inspection sample obtained by the above measurement was normalized to obtain the normalized reflected light distribution, and the normalized reflected light distribution was fitted by the multiple Gaussian function F (r) represented by the above formula (1). Thereby, parameters constituting each of the first Gaussian function $f_1$ (r) and the second Gaussian function $f_2$ (r) were obtained. The parameters constituting each of the first Gaussian function $f_1$ (r) and the second Gaussian function $f_2$ (r) in the inspection sample are shown below.

$A_1 = 0.886$
$A_2 = 0.155$
$\mu 1 = 1903$
$\mu_2 = 1890$
$\sigma_1 = 19.5$
$94_2 = 46.2$ (2-4) Calculation The parameter $A_1$ of the first Gaussian function $f_1$ (r) obtained for the inspection sample was applied to the curving correlation of equation (3), to calculate SORI of the inspection sample, which revealed that the SORI of the inspection sample was 5.76 μm. Even when applied to the curving correlation of the equation (3)', the values were similar.

Further, the standard deviation $\sigma_2$ of the second Gaussian function $f_2$ (r) obtained for the inspection sample was applied to the roughness correlation of equation (4), to calculate the rough area ratio of the inspection sample, which revealed that the rough area ratio of the inspection sample was 18.7%.

(2-5) Selection

The above results revealed that the SORI of the inspection sample was 20 μm or less, and the rough area ratio of the inspection sample was 20% or less. Therefore, this inspection sample was selected as the best product.

(2-6) Confirmation of Correlation

To check the correlation accuracy of the above calculation results, the SORI of the inspection sample was measured by a flatness measuring device, and the rough area ratio of the inspection sample was measured by the Nomarski microscope in the same way as in the reference samples 1 to 5.

The result revealed that the SORI of the inspection sample measured by the flatness measuring device is 5.92 μm, that is, revealed that the SORI of the inspection sample calculated by applying the parameter $A_1$ of the first Gaussian function $f_1$ (r) to the curving correlation of the equation (3) is almost the same as the SORI of the inspection sample measured by the flatness measuring device.

The result also revealed that the roughness area ratio of the inspection sample measured by the Nomarski microscope was 8.5%, that is, the result revealed that the rough area ratio of the inspection sample calculated by applying the standard deviation $\sigma_2$ of the second Gaussian function $f_2$ (r) to the roughness correlation of the equation (4) is almost the same as the rough area ratio of the inspection sample measured by the Nomarski microscope.

As described above, it was confirmed by separating the influence of the curvature of the semiconductor structure and the influence of the surface roughness of the semiconductor structure in the reflected light distribution of the semiconductor structure, the parameter of the first Gaussian function $f_1$ (r) can be correlated to the curving amount of the semiconductor structure with high accuracy, and the parameter of the second Gaussian function $f_2$ (r) can be correlated to the surface roughness of the semiconductor structure with high accuracy.

<Preferable Aspects of the Present Invention>

Preferable aspects of the present invention will be supplementarily described hereafter.

(Supplementary Description 1)

There is provided a method for manufacturing a semiconductor structure, including:

preparing a plate-like semiconductor structure; and inspecting the semiconductor structure, the inspection of the semiconductor further including:

performing a measurement of irradiating a surface of the semiconductor structure with a light from a light source in an oblique direction to the surface, and detecting a reflected light reflected or scattered by the surface by a two-dimensional detector, at a plurality of locations within at least a predetermined range of the surface of the semiconductor structure, to acquire a reflected light distribution that is a distribution of an integrated value obtained by integrating intensity of the reflected light measured at the plurality of locations, with respect to a position at the detector; and fitting the reflected light distribution by a multiple Gaussian function obtained by adding at least a first Gaussian function and a second Gaussian function distributed more widely than the first Gaussian function, to acquire a parameter of the second Gaussian function as an index corresponding to a surface roughness of the semiconductor structure.

(Supplementary Description 2)

There is provided the method for manufacturing a semiconductor structure according to supplementary description 1, including: selecting the semiconductor structure based on the parameter of the second Gaussian function.

(Supplementary Description 3)

There is provided the method for manufacturing a semiconductor structure according to supplementary description 2, wherein the acquisition of the parameter includes: acquiring a standard deviation of the second Gaussian function, and the selection of the semiconductor structure includes: selecting the semiconductor structure based on the standard deviation of the second Gaussian function.

(Supplementary Description 4)

There is provided the method for manufacturing a semiconductor structure according to any one of the supplementary descriptions 1 to 3, including:

preparing a roughness correlation in which the parameter of the second Gaussian function is correlated to the surface roughness of the semiconductor structure, before the inspection of the semiconductor structure, the inspection of the semiconductor structure further including: applying the parameter of the second Gaussian function acquired in the acquisition of the parameter, to the roughness correlation, to calculate a surface roughness of the semiconductor structure.

(Supplementary Description 5)

There is provided the method for manufacturing a semiconductor structure according to the supplementary description 4, wherein the preparation of the roughness correlation includes: correlating a roughness area ratio, which is a ratio of an area of a roughened portion with respect to a surface area of the semiconductor structure, to the parameter of the second Gaussian function, in the roughness correlation, and the calculation of the surface roughness includes: applying the parameter of the second Gaussian function to the roughness correlation, to calculate the roughness area ratio of the semiconductor structure.

(Supplementary Description 6)

There is provided the method for manufacturing a semiconductor structure according to any one of the supplementary descriptions 1 to 5, wherein the acquisition of the parameter includes: acquiring the parameter of the second Gaussian function, and acquiring a parameter of the first Gaussian function as an index corresponding to a curvature of the semiconductor structure.

(Supplementary Description 7)

There is provided the method for manufacturing a semiconductor structure according to the supplementary description 6, including: selecting the semiconductor structure based on the parameter of the first Gaussian function.

(Supplementary Description 8)

There is provided the method for manufacturing a semiconductor structure according to the supplementary description 7, wherein the acquisition of the parameter includes: acquiring a standard deviation or a peak value of the first Gaussian function, and the selection of the semiconductor structure includes: selecting the semiconductor structure based on the standard deviation or the peak value of the first Gaussian function.

(Supplementary Description 9)

There is provided a method for manufacturing a semiconductor structure, including:

preparing a plate-like semiconductor structure; and inspecting the semiconductor structure, the inspection of the semiconductor structure further including:

performing a measurement of irradiating a surface of the semiconductor structure with a light from a light source in an oblique direction to the surface, and detecting a reflected light reflected or scattered by the surface by a two-dimensional detector, at a plurality of locations within at least a predetermined range of the surface of the semiconductor structure, to acquire a reflected light distribution that is a distribution of an integrated value obtained by integrating intensity of the reflected light measured at the plurality of locations, with respect to a position at the detector; and fitting the reflected light distribution by a multiple Gaussian function obtained by adding at least a first Gaussian function and a second Gaussian function distributed more widely than the first Gaussian function, to acquire a parameter of the first Gaussian function as an index corresponding to a curving amount of the semiconductor structure.

(Supplementary Description 10)

There is provided an inspection method, including:

performing a measurement of irradiating a surface of a plate-like measurement object with a light from a light source in an oblique direction to the surface, and detecting a reflected light reflected or scattered by the surface by a two-dimensional detector, at a plurality of locations within at least a predetermined range of the surface of the measurement object, to acquire a reflected light distribution that is a distribution of an integrated value obtained by integrating intensity of the reflected light measured at the plurality of locations, with respect to a position at the detector; and fitting the reflected light distribution by a multiple Gaussian function obtained by adding at least a first Gaussian function and a second Gaussian function distributed more widely than the first Gaussian function, to acquire a parameter of the second Gaussian function as an index corresponding to a surface roughness of the measurement object.

(Supplementary Description 11)

There is provided an inspection method, including:

performing a measurement of irradiating a surface of a plate-like measurement object with a light from a light source in an oblique direction to the surface, and detecting a reflected light reflected or scattered by the surface by a two-dimensional detector, at a plurality of locations within at least a predetermined range of the surface of the measurement object, to acquire a reflected light distribution that is a distribution of an integrated value obtained by integrating intensity of the reflected light measured at the plurality of locations, with respect to a position at the detector; and fitting the reflected light distribution by a multiple Gaussian function obtained by adding at least a first Gaussian function and a second Gaussian function distributed more widely than the first Gaussian function, to acquire a parameter of the first Gaussian function as an index corresponding to a curving amount of the measurement object.

(Supplementary Description 12)

There is provided a semiconductor structure, including:

a substrate made of a group III nitride semiconductor having a predetermined n-type impurity concentration; and a semiconductor layer provided on the substrate, and made of a group III nitride semiconductor having an n-type impurity concentration lower than that of the substrate, wherein $\sigma_2 \leq 90$ is obtained, when a measurement of irradiating a surface of the semiconductor layer with a light having a wavelength of 405 nm from a light source configured by a laser at an angle of 50° to 80°, and detecting a reflected light reflected or scattered by the surface by a two-dimensional detector with a side length of 1.67 μm per pixel, is performed within an entire range of the surface of the semiconductor layer, to acquire a reflected light distribution obtained by normalizing a distribution of an integrated value obtained by integrating intensity of the reflected light measured in the entire range of the surface with respect to a position at the detector, and the reflected light distribution is fitted by a multiple Gaussian function F (r) represented by the fol lowing equation (1).

[Formula 3]

$$F(r) = A_1 \exp\left(-\frac{(r-\mu_1)^2}{(2\sigma_1)^2}\right) + A_2 \exp\left(-\frac{(r-\mu_2)^2}{(2\sigma_2)^2}\right) \quad (1)$$

(wherein $\sigma_2 > \sigma_1$)

(Supplementary Description 13)

There is provided a semiconductor structure, including:

a substrate made of a group III nitride semiconductor having a predetermined n-type impurity concentration; and a semiconductor layer provided on the substrate, and made of a group III nitride semiconductor having an n-type impurity concentration lower than that of the substrate, wherein $0.5 \leq A_1 \leq 1$ is obtained, when a measurement of irradiating a surface of the semiconductor layer with a light having a wavelength of 405 nm from a light source configured by a laser at an angle of 50° to 80°, and detecting a reflected light reflected or scattered by the surface by a two-dimensional detector with a side length of 1.67 μm per pixel, is performed within an entire range of the surface of the semiconductor layer, to acquire a reflected light distribution obtained by normalizing a distribution of an integrated value obtained by integrating intensity of the reflected light measured in the entire range of the surface with respect to a position at the detector, and the reflected light distribution is fitted by a multiple Gaussian function F (r) represented by the following equation (1).

[Formula 4]

$$F(r) = A_1 \exp\left(-\frac{(r-\mu_1)^2}{(2\sigma_1)^2}\right) + A_2 \exp\left(-\frac{(r-\mu_2)^2}{(2\sigma_2)^2}\right) \quad (1)$$

(wherein $\sigma_2 \geq \sigma_1$)

(Supplementary Description 14)

There is provided an inspection device, including:

a light source that irradiates a surface of a plate-like measurement object with a light in an oblique direction to the surface;

a two-dimensional detector that detects a reflected light reflected or scattered by the surface; and a control unit that controls the light source and the detector, wherein the control unit performs:

a processing of performing a measurement of irradiating the surface of the measurement object with a light from the light source, and detecting a reflected light reflected or scattered by the surface by the detector, at a plurality of locations within at least a predetermined range of the surface of the measurement object, to acquire a reflected light distribution that is a distribution of an integrated value obtained by integrating intensity of the reflected light measured at the plurality of locations, with respect to a position at the detector; and a processing of fitting the reflected light distribution by a multiple Gaussian function obtained by adding at least a first Gaussian function and a second Gaussian function distributed more widely than the first Gaussian function, to acquire a parameter of the second Gaussian function as an index corresponding to a surface roughness of the measurement object.

(Supplementary Description 15)

There is provided an inspection program, which is a program for causing an inspection device to execute a program using a computer, the inspection device having a light source that irradiates a light in an oblique direction to a surface of a plate-like measurement object, and a two-dimensional detector that detects a reflected light reflected or scattered by the surface, wherein the inspection device performs the following procedures using the computer:

a procedure of performing a measurement of irradiating the surface of the measurement object with a light from the light source, and detecting a reflected light reflected or scattered by the surface, at a plurality of locations within at least a predetermined range of the surface of the measurement object, to acquire a reflected light distribution that is a distribution of an integrated value obtained by integrating intensity of the reflected light measured at the plurality of locations, with respect to a position at the detector; and a procedure of fitting the reflected light distribution by a multiple Gaussian function obtained by adding at least a first Gaussian function and a second Gaussian function distributed more widely than the first Gaussian function, to acquire a parameter of the second Gaussian function as an index corresponding to a surface roughness of the measurement object.

DESCRIPTION OF SIGNS AND NUMERALS

10 Semiconductor structure
11 Reference structure
12 Inspection structure
30 Inspection device
100 Substrate
100a Main surface
120 Semiconductor layer
120a Main surface
320 Stage
340 Light source
360 Detector
400 Control unit
410 CPU
420 RAM
430 Storage device
440 I/O port
450 Display unit
460 Input unit

What is claimed is:

1. A method for manufacturing a semiconductor structure, comprising:
preparing a plate-like semiconductor structure; and
inspecting the semiconductor structure, the inspection of the semiconductor further comprising:
performing a measurement of irradiating a surface of the semiconductor structure with a light from a light source in an oblique direction to the surface, and detecting a reflected light reflected or scattered by the surface by a two-dimensional detector, at a plurality of locations within at least a predetermined range of the surface of the semiconductor structure, to acquire a reflected light distribution that is a distribution of an integrated value obtained by integrating intensity of the reflected light measured at the plurality of locations, with respect to a position at the detector; and
fitting the reflected light distribution by a multiple Gaussian function obtained by adding at least a first Gaussian function and a second Gaussian function distributed more widely than the first Gaussian function, to acquire a parameter of the second Gaussian function as an index corresponding to a surface roughness of the semiconductor structure.

2. The method for manufacturing a semiconductor structure according to claim 1, comprising: selecting the semiconductor structure based on the parameter of the second Gaussian function.

3. The method for manufacturing a semiconductor structure according to claim 1, comprising:
preparing a roughness correlation in which the parameter of the second Gaussian function is correlated to the surface roughness of the semiconductor structure, before the inspection of the semiconductor structure,
the inspection of the semiconductor structure further comprising: applying the parameter of the second Gaussian function acquired in the acquisition of the parameter to the roughness correlation, to calculate a surface roughness of the semiconductor structure.

4. The method for manufacturing a semiconductor structure according to claim 1, wherein the acquisition of the parameter further comprises:
acquiring the parameter of the second Gaussian function, and acquiring a parameter of the first Gaussian function as an index corresponding to a curving of the semiconductor structure.

5. A method for manufacturing a semiconductor structure, comprising:
preparing a plate-like semiconductor structure; and
inspecting the semiconductor structure,
the inspection of the semiconductor further comprising:
performing a measurement of irradiating a surface of the semiconductor structure with a light from a light source in an oblique direction to the surface, and detecting a reflected light reflected or scattered by the surface by a two-dimensional detector, at a plurality of locations within at least a predetermined range of the surface of the semiconductor structure, to acquire a reflected light distribution that is a distribution of an integrated value obtained by integrating intensity of the reflected light measured at the plurality of locations, with respect to a position at the detector; and
fitting the reflected light distribution by a multiple Gaussian function obtained by adding at least a first Gaussian function and a second Gaussian function distributed more widely than the first Gaussian function, to acquire a parameter of the first Gaussian function as an index corresponding to a curving amount of the semiconductor structure.

6. An inspection method, comprising:
performing a measurement of irradiating a surface of a plate-like measurement object with a light from a light source in an oblique direction to the surface, and detecting a reflected light reflected or scattered by the surface by a two-dimensional detector, at a plurality of locations within at least a predetermined range of the surface of the measurement object, to acquire a reflected light distribution that is a distribution of an integrated value obtained by integrating intensity of the reflected light measured at the plurality of locations, with respect to a position at the detector; and
fitting the reflected light distribution by a multiple Gaussian function obtained by adding at least a first Gaussian function and a second Gaussian function distributed more widely than the first Gaussian function, to acquire a parameter of the second Gaussian function as an index corresponding to a surface roughness of the measurement object.

7. An inspection method, comprising:
performing a measurement of irradiating a surface of a plate-like measurement object with a light from a light source in an oblique direction to the surface, and detecting a reflected light reflected or scattered by the surface by a two-dimensional detector, at a plurality of locations within at least a predetermined range of the surface of the measurement object, to acquire a reflected light distribution that is a distribution of an integrated value obtained by integrating intensity of the reflected light measured at the plurality of locations, with respect to a position at the detector; and
fitting the reflected light distribution by a multiple Gaussian function obtained by adding at least a first Gaussian function and a second Gaussian function distributed more widely than the first Gaussian function, to acquire a parameter of the first Gaussian function as an index corresponding to a curving amount of the measurement object.

* * * * *

UNITED STATES PATENT AND TRADEMARK OFFICE
CERTIFICATE OF CORRECTION

PATENT NO. : 11,473,907 B2
APPLICATION NO. : 16/492299
DATED : October 18, 2022
INVENTOR(S) : Horikiri It is certified that error appears in the above-identified patent and that said Letters Patent is hereby corrected as shown below:

In the Specification

Column 10, Line 63, "was measured b AFM" should read -- was measured by AFM --

Column 14, Line 22, "correlation and the rough" should read -- correlation and the roughness --

Column 14, Line 49, "acquisition step S131, and" should read -- acquisition step S134, and --

Column 18, Line 50, "parameter f the second" should read -- parameter of the second --

Column 24, Line 27, "$94_2$=46.2" should read -- $\sigma_2 = 46.2$ --

Signed and Sealed this
Fourth Day of July, 2023

Katherine Kelly Vidal
*Director of the United States Patent and Trademark Office*